US008648416B1

(12) United States Patent
Khayat et al.

(10) Patent No.: US 8,648,416 B1
(45) Date of Patent: Feb. 11, 2014

(54) LDMOS SENSE TRANSISTOR STRUCTURE FOR CURRENT SENSING AT HIGH VOLTAGE

(75) Inventors: Joseph Maurice Khayat, Bedford, NH (US); Marie Denison, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/554,863

(22) Filed: Jul. 20, 2012

(51) Int. Cl.
*H01L 29/66* (2006.01)

(52) U.S. Cl.
USPC .................. 257/337; 257/335; 257/E27.016; 257/E29.256; 438/135

(58) Field of Classification Search
USPC .................. 257/335, 337, E27.016, E29.256; 438/135
See application file for complete search history.

*Primary Examiner* — Thao Le
*Assistant Examiner* — Matthew Gordon
(74) *Attorney, Agent, or Firm* — Jacqueline J. Garner; Wade J. Brady, III; Frederick J. Telecky, Jr.

(57) ABSTRACT

An integrated circuit includes a high voltage n-channel MOS power transistor integrated with a high voltage n-channel MOS blocking transistor. The power transistor and the blocking transistor have electrically coupled drain contact regions. In one embodiment, a drain area of the power transistor is separate from a drain area of the blocking transistor. In another embodiment, the drain area of the power transistor is contiguous with the drain area of the blocking transistor. The power transistor and the blocking transistor have drain extensions with drift areas. The power transistor drift area is laterally adjacent to both sides of the blocking transistor drift area. The drift areas are aligned so that breakdown does not occur between the power transistor and the blocking transistor. The body of the blocking transistor is isolated from the substrate.

20 Claims, 14 Drawing Sheets

LDMOS SENSE TRANSISTOR STRUCTURE FOR CURRENT SENSING AT HIGH VOLTAGE

CROSS-REFERENCE TO RELATED APPLICATIONS

The following co-pending patent application is related and hereby incorporated by reference: U.S. patent application Ser. No. 13/554,846. With its mention in this section, this patent application is not admitted to be prior art with respect to the present invention.

FIELD OF THE INVENTION

This invention relates to the field of integrated circuits. More particularly, this invention relates to high-voltage transistor structures in integrated circuits.

BACKGROUND OF THE INVENTION

An integrated circuit may contain a high voltage n-channel metal oxide semiconductor (MOS) power transistor which is configured to operate at a drain voltage which is significantly higher than an operating voltage for other transistors and circuits in the integrated circuit. For example, an integrated circuit which contains transistors and circuits which operate at 10 volts or less may also include a high voltage n-channel MOS transistor which operates at a drain voltage of over 300 volts and switches several amps. The body of the high voltage transistor may be directly connected to the substrate of the integrated circuit, for example to provide a simpler fabrication process for the integrated circuit, compared to an integrated circuit with an isolated high voltage transistor. It may be desirable to determine if current through the high voltage transistor is above a certain value when the high voltage transistor is in the on state, without increasing the fabrication complexity of the integrated circuit or unduly increasing the size of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may include a high voltage n-channel MOS power transistor integrated with a high voltage n-channel MOS blocking transistor which have coupled drain terminals and aligned drift areas in their respective drain extensions. The drift areas are aligned so that breakdown does not occur between the power transistor and the blocking transistor. The body of the power transistor may be directly connected to the substrate of the integrated circuit, while the body of the blocking transistor is isolated from the substrate.

DETAILED DESCRIPTION OF EXAMPLE EMBODIMENTS

Figure 1:
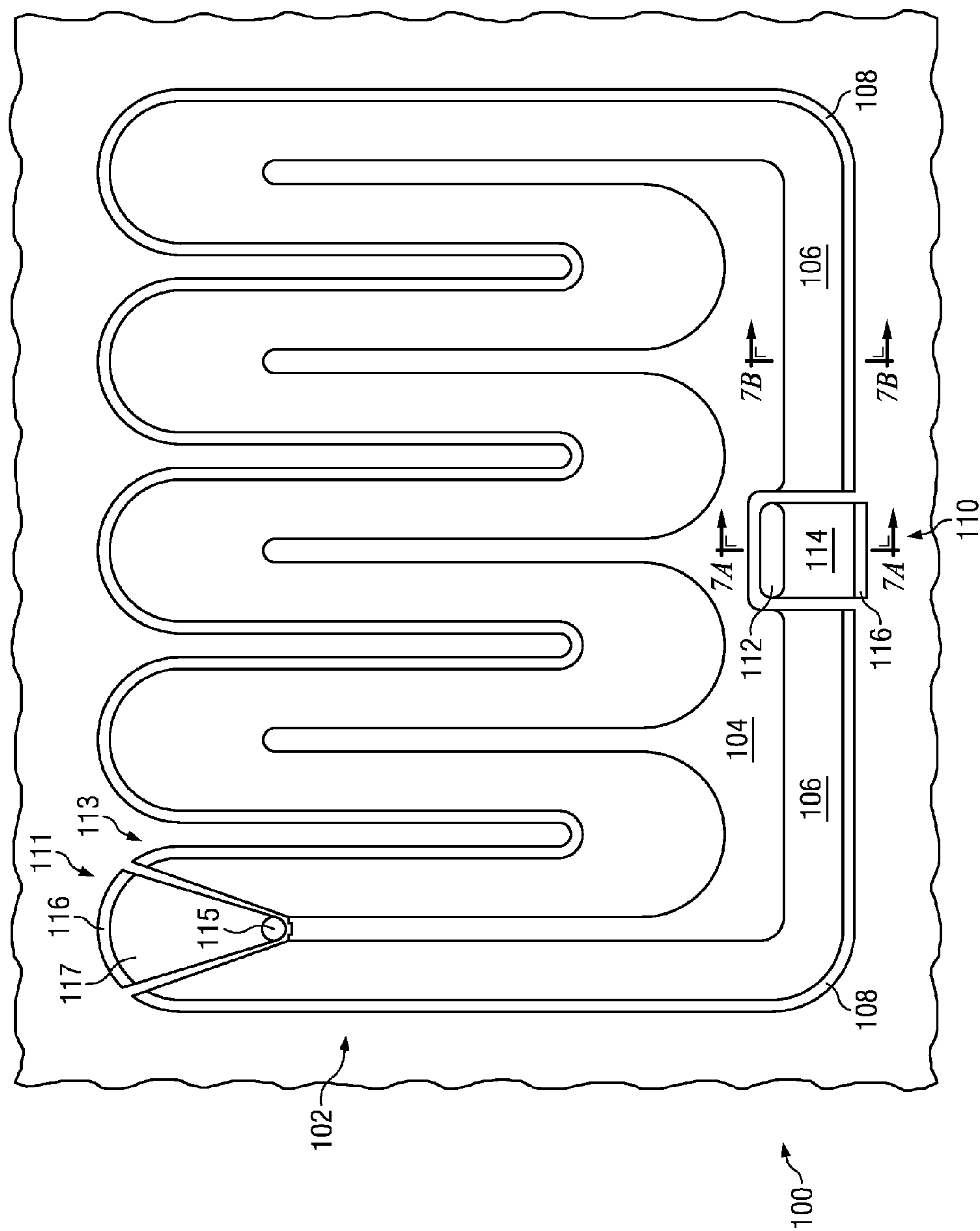
FIG. 1 is a top view of an integrated circuit containing a high voltage re-channel MOS power transistor integrated with a high voltage n-channel MOS blocking transistor, formed according to a first embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may include a high voltage n-channel MOS power transistor integrated with a high voltage n-channel MOS blocking transistor. The power transistor and the blocking transistor have coupled drain terminals. In one embodiment, a drain area of the power transistor is separate from a drain area of the blocking transistor, and drain contact regions in the respective drain areas are electrically coupled through metal interconnects of the integrated circuit, possibly including a current sense resistor. In another embodiment, the drain area of the power transistor is contiguous with the drain area of the blocking transistor, so that the drain contact regions in the respective the drain areas are electrically coupled through n-type doped regions in a substrate of the integrated circuit. The power transistor and the blocking transistor have drain extensions with drift areas, so as to be able to operate at drain voltages over 300 volts. The power transistor drift area is laterally adjacent to both sides of the blocking transistor drift area. The drift areas are aligned so that breakdown does not occur between the power transistor and the blocking transistor. The body of the power transistor may be directly connected to the substrate of the integrated circuit, which may desirably reduce a size and fabrication complexity of the integrated circuit, while the body of the blocking transistor is isolated from the substrate, to allow a source node of the blocking transistor to be connected to another component of the integrated circuit, such as an input to a comparator. In one embodiment, the power transistor drift area and the blocking transistor drift area may be formed concurrently and have a same layer structure. In another embodiment, the power transistor drift area and the blocking transistor drift area may have a different layer structure.

For the purposes of this description, the term “RESURF” will be understood to refer to a material which reduces an electric field in an adjacent semiconductor region. A RESURF region may be for example a semiconductor region with an opposite conductivity type from the adjacent semiconductor region. RESURF structures are described in Appels, et. al., “Thin Layer High Voltage Devices” Philips J, Res. 35 1-13, 1980.

For the purposes of this description, the term “vertically cumulative doping density” of a doped layer is understood to mean an integrated sum of an instant local doping density in the doped layer from a bottom surface of the layer to a top surface of the layer. The instant local doping density is described in units of atoms/cm$^3$, and the vertically cumulative doping density is described in units of atoms/cm$^2$.

FIG. 1 is a top view of an integrated circuit containing a high voltage re-channel MOS power transistor integrated with a high voltage n-channel MOS blocking transistor, formed according to a first embodiment. In the integrated circuit 100, the power transistor 102 has a central drain area 104, a drift area 106 surrounding the drain area 104, and a channel/source area 108 surrounding the drift area 106, except at the blocking transistor 110. The blocking transistor 110 has a drain area 112 which is proximate to, and separate from, the power transistor drain area 104. A blocking transistor drain contact region in the blocking transistor drain area 112 is electrically coupled to a power transistor drain contact region in the power transistor drain area 104 through metal interconnects, not shown, of the integrated circuit 100. The blocking transistor 110 has a drift area 114 abutting the blocking transistor drain area 112, so that a boundary between the blocking transistor drain area 112 and the blocking transistor drift area 114 is aligned with a boundary between the power transistor drain area 104 and the power transistor drift area 106. The blocking transistor 110 has a channel/source area 116 abutting the blocking transistor drift area 114 opposite from the blocking transistor drain area 112 and proximate to the power transistor channel/source area 108. The power transistor drift area 106 is laterally adjacent to both sides of the blocking transistor drift area 114. In a version of the instant embodiment depicted in FIG. 1, the blocking transistor drift area 114 is separated from the power transistor drift area 106 by semiconductor material of a substrate of the integrated circuit 100 from the blocking transistor drain area 112 to the blocking transistor channel/source area 116. The blocking transistor drift area 114 is aligned with the power transistor drift area 106 so that breakdown does not occur between the blocking transistor 110 and the power transistor 102.

An alternate embodiment may have a fan-shaped blocking transistor 111 disposed at a tip of a finger 113 of the power transistor 102. The blocking transistor 111 includes a drain area 115 which is contiguous with the power transistor drain area 104, and electrically coupled to the power transistor drain area 104. The blocking transistor 111 has a fan-shaped drift area 117 which abuts the blocking transistor drain area 115. The power transistor drift area 106 is laterally adjacent to both sides of the blocking transistor drift area 117; the blocking transistor drift area 117 is aligned with the power transistor drift area 106 so that breakdown does not occur between the blocking transistor 111 and the power transistor 102. The blocking transistor 111 has an arc-shaped channel/source area 119 abutting the blocking transistor drift area 117 opposite from the blocking transistor drain area 115 and proximate to the power transistor channel/source area 108.

The channel/source area 116 of the blocking transistor 110 or 111 may be connected to another component of the integrated circuit, for example a comparator. Location of the blocking transistor 110 or 111 with respect to the power transistor 102 may be chosen to facilitate a layout of the integrated circuit 100.

Figure 2:
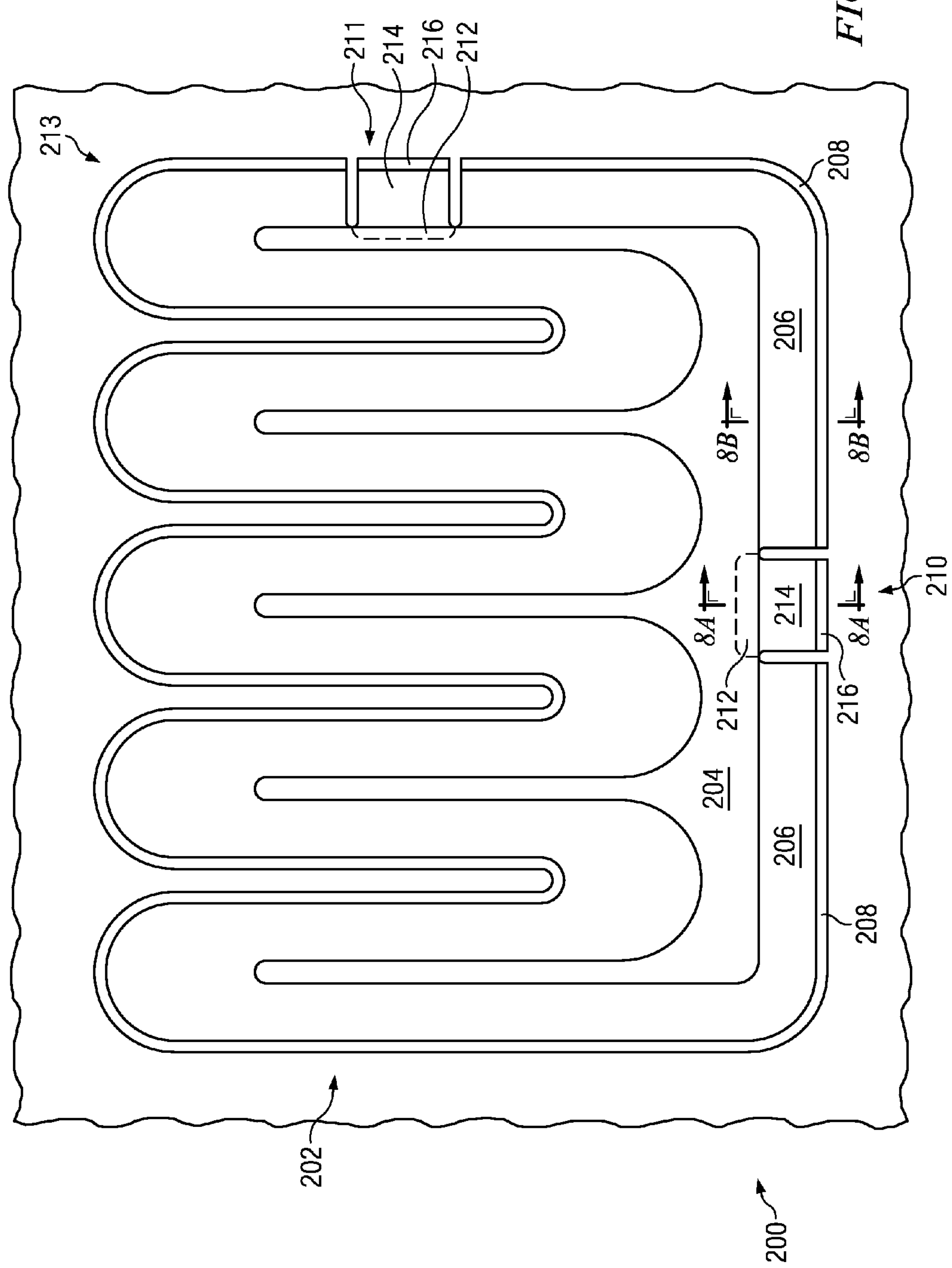
FIG. 2 is a top view of an integrated circuit containing a high voltage re-channel MOS power transistor integrated with a high voltage n-channel MOS blocking transistor, formed according to a second embodiment.

FIG. 2 is a top view of an integrated circuit containing a high voltage re-channel MOS power transistor integrated with a high voltage n-channel MOS blocking transistor, formed according to a second embodiment. In the integrated circuit 200, the power transistor 202 has a central drain area 204, a drift area 206 surrounding the drain area 204, and a channel/source area 208 surrounding the drift area 206, except at the blocking transistor 210. The blocking transistor 210 has a drain area 212 which is contiguous with the power transistor drain area 204, so that a blocking transistor drain contact region in the blocking transistor drain area 212 is electrically coupled to a power transistor drain contact region in the power transistor drain area 204 through n-type doped regions in a substrate of the integrated circuit 200. The blocking transistor 210 has a drift area 214 abutting the blocking transistor drain area 212, so that a boundary between the blocking transistor drain area 212 and the blocking transistor drift area 214 is aligned with a boundary between the power transistor drain area 204 and the power transistor drift area 206. The blocking transistor 210 has a channel/source area 216 abutting the blocking transistor drift area 214 opposite from the blocking transistor drain area 212 and proximate to the power transistor channel/source area 208. The blocking transistor drift area 214 is separated from the power transistor drift area 206 by semiconductor material of a substrate of the integrated circuit 200. The power transistor drift area 206 is laterally adjacent to both sides of the blocking transistor drift area 214. The blocking transistor drift area 214 is aligned with the power transistor drift area 206 so that breakdown does not occur between the blocking transistor 210 and the power transistor 202. In an alternate embodiment, a blocking transistor 211 may be disposed in a finger 213 of the power transistor 202.

Figure 3:
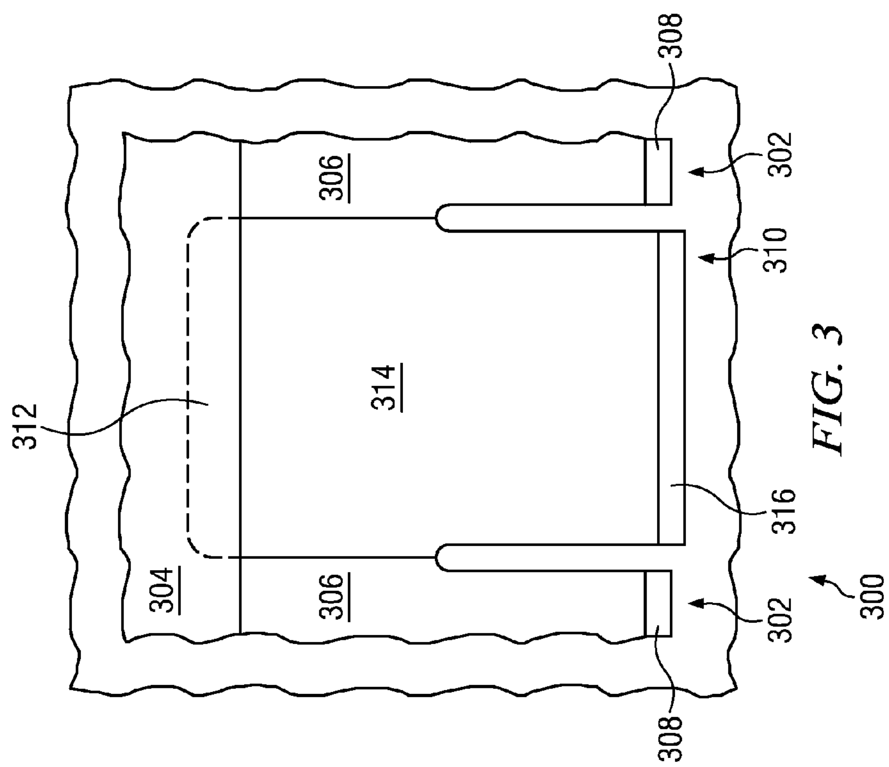
FIG. 3 is a top view of an integrated circuit containing a power transistor integrated with a blocking transistor, formed according to a variation of either of the embodiments described in reference to FIG. 1 and FIG. 2.

FIG. 3 is a top view of an integrated circuit containing a power transistor integrated with a blocking transistor, formed according to a variation of either of the embodiments described in reference to FIG. 1 and FIG. 2. In the integrated circuit 300, the power transistor 302 has a central drain area 304, a drift area 306 and a channel/source area 308 similar to that described in reference to FIG. 1 or FIG. 2. The blocking transistor 310 has a drain area 312, a drift area 314 and a channel/source area 316 similar to that described in reference to FIG. 1 or FIG. 2. The blocking transistor drain area 312 may be contiguous with the power transistor drain area 304 as described in reference to FIG. 2 or may be separated from the power transistor drain area 304 as described in reference to FIG. 1. The blocking transistor drift area 314 abuts the power transistor drift area 306 from the drain areas 304 and 312 to midway between the power transistor drain area 304 and the power transistor channel/source area 308. The blocking transistor drift area 314 is separated from the power transistor drift area 306 from midway between the power transistor drain area 304 and the power transistor channel/source area 308 to the power transistor channel/source area 308 by semiconductor material of a substrate of the integrated circuit 300. The blocking transistor drift area 314 and the power transistor drift area 306 are formed so as to provide uniform depletion during operation of the integrated circuit 300 so that undesired current levels between the blocking transistor drift area 314 and the power transistor drift area 306 are avoided.

Figure 4:
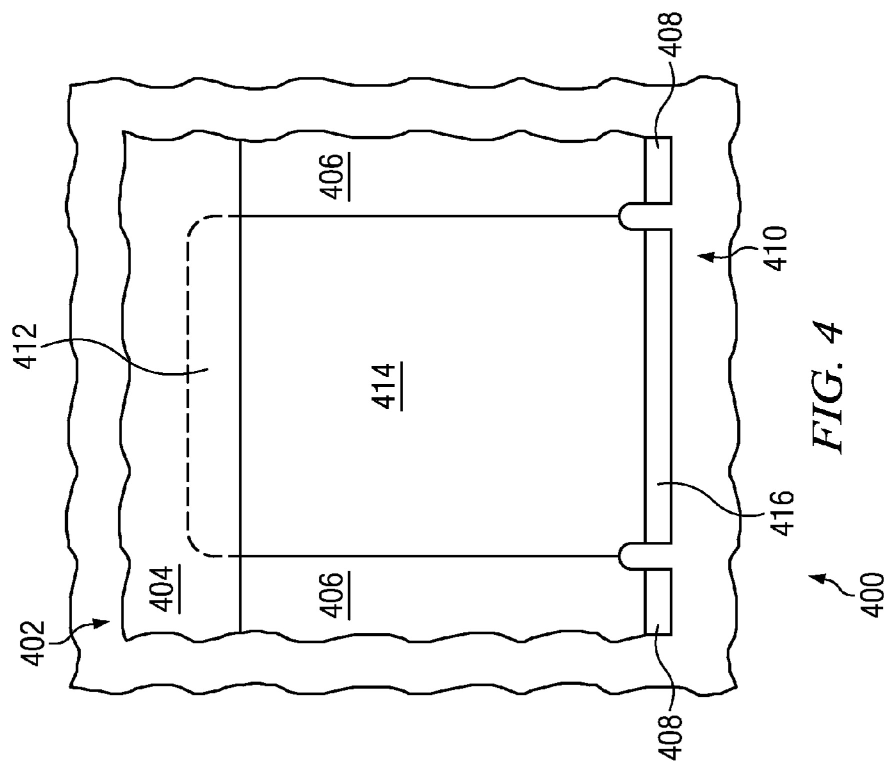
FIG. 4 is a top view of an integrated circuit containing a power transistor integrated with a blocking transistor, formed according to another variation of either of the embodiments described in reference to FIG. 1 and FIG. 2.

FIG. 4 is a top view of an integrated circuit containing a power transistor integrated with a blocking transistor, formed according to another variation of either of the embodiments described in reference to FIG. 1 and FIG. 2. In the integrated circuit 400, the power transistor 402 has a central drain area 404, a drift area 406 and a channel/source area 408 similar to that described in reference to FIG. 1 or FIG. 2. The blocking transistor 410 has a drain area 412, a drift area 414 and a channel/source area 416 similar to that described in reference to FIG. 1 or FIG. 2. The blocking transistor drain area 412 may be contiguous with the power transistor drain area 404 as described in reference to FIG. 2 or may be separated from the power transistor drain area 404 as described in reference to FIG. 1. The blocking transistor drift area 414 abuts the power transistor drift area 406 from the drain areas 404 and 412 to the power transistor channel/source area 408. The blocking transistor drift area 414 and the power transistor drift area 406 are formed so as to provide uniform depletion during operation of the integrated circuit 400 so that undesired current levels between the blocking transistor drift area 414 and the power transistor drift area 406 are avoided.

Figure 5:
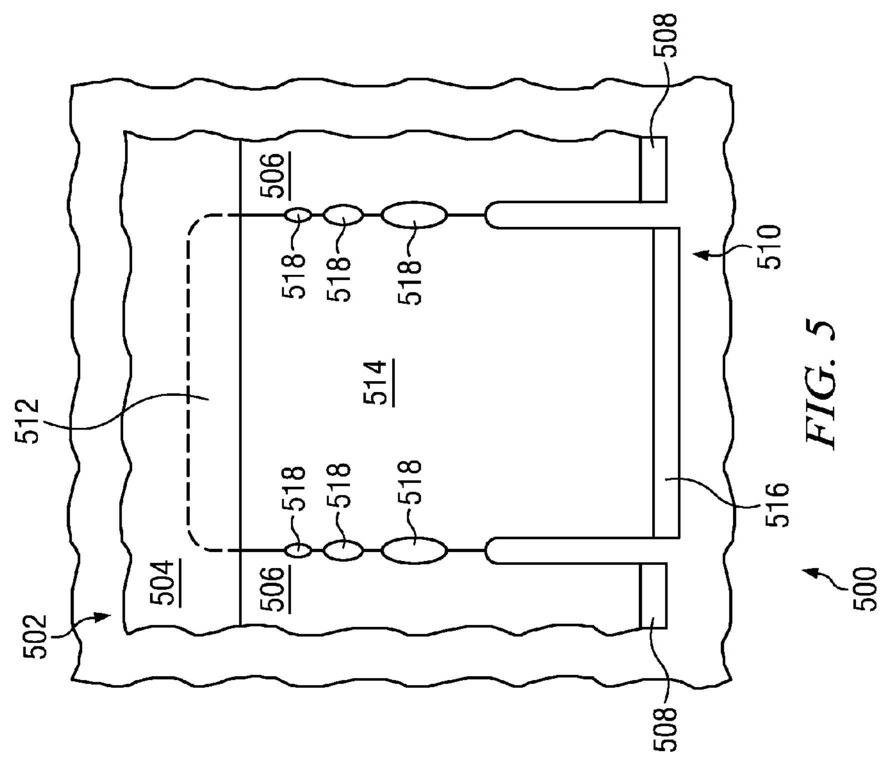
FIG. 5 is a top view of an integrated circuit containing a power transistor integrated with a blocking transistor, formed according to a further variation of either of the embodiments described in reference to FIG. 1 and FIG. 2.

FIG. 5 is a top view of an integrated circuit containing a power transistor integrated with a blocking transistor, formed according to a further variation of either of the embodiments described in reference to FIG. 1 and FIG. 2. In the integrated circuit 500, the power transistor 502 has a central drain area 504, a drift area 506 and a channel/source area 508 similar to that described in reference to FIG. 1 or FIG. 2. The blocking transistor 510 has a drain area 512, a drift area 514 and a channel/source area 516 similar to that described in reference to FIG. 1 or FIG. 2. The blocking transistor drain area 512 may be contiguous with the power transistor drain area 504 as described in reference to FIG. 2 or may be separated from the power transistor drain area 504 as described in reference to FIG. 1. The blocking transistor drift area 514 abuts the power transistor drift area 506 at the drain areas 504 and 512. Farther away from the drain areas 504 and 512, the blocking transistor drift area 514 is separated from the power transistor drift area 506 by semiconductor material of a substrate of the integrated circuit 500 having a graded doping profile, depicted in FIG. 5 as a series of increasing open areas 518. The graded doping profile may extend partway between the power transistor drain area 504 and the power transistor channel/source area 508, as depicted in FIG. 5, or may effectively extend from the power transistor drain area 504 to the power transistor channel/source area 508. The graded doping profile may be formed, for example, by ion implanting dopants into the blocking transistor drift area 514 and/or the power transistor drift area 506 through an ion implant mask having graded open areas. The blocking transistor drift area 514 and the power transistor drift area 506 are formed so as to provide uniform depletion during operation of the integrated circuit 500 so that undesired current levels between the blocking transistor drift area 514 and the power transistor drift area 506 are avoided.

Figure 6:
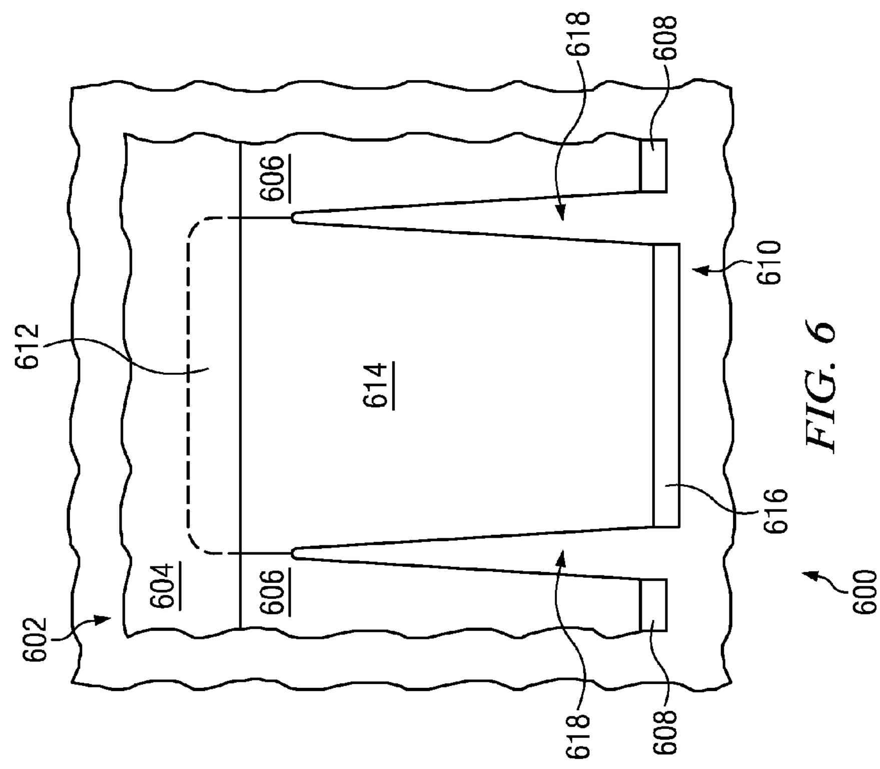
FIG. 6 is a top view of an integrated circuit containing a power transistor integrated with a blocking transistor, formed according to another variation of either of the embodiments described in reference to FIG. 1 and FIG. 2.

FIG. 6 is a top view of an integrated circuit containing a power transistor integrated with a blocking transistor, formed according to another variation of either of the embodiments described in reference to FIG. 1 and FIG. 2. In the integrated circuit 600, the power transistor 602 has a central drain area 604, a drift area 606 and a channel/source area 608 similar to that described in reference to FIG. 1 or FIG. 2. The blocking transistor 610 has a drain area 612, a drift area 614 and a channel/source area 616 similar to that described in reference to FIG. 1 or FIG. 2. The blocking transistor drain area 612 may be contiguous with the power transistor drain area 604 as described in reference to FIG. 2 or may be separated from the power transistor drain area 604 as described in reference to FIG. 1. The blocking transistor drift area 614 abuts the power transistor drift area 606 from the drain areas 604 and 612 to the power transistor channel/source area 608. The blocking transistor drift area 614 is separated from the power transistor drift area 606 by a tapered region 618 of semiconductor material of a substrate of the integrated circuit 600. The tapered region 618 may extend partway between the power transistor drain area 604 and the power transistor channel/source area 608, or may effectively extend from the power transistor drain area 604 to the power transistor channel/source area 608 as depicted in FIG. 6. The blocking transistor drift area 614 and the power transistor drift area 606 are formed so as to provide uniform depletion during operation of the integrated circuit 400 so that undesired current levels between the blocking transistor drift area 614 and the power transistor drift area 606 are avoided.

Figure 7A:
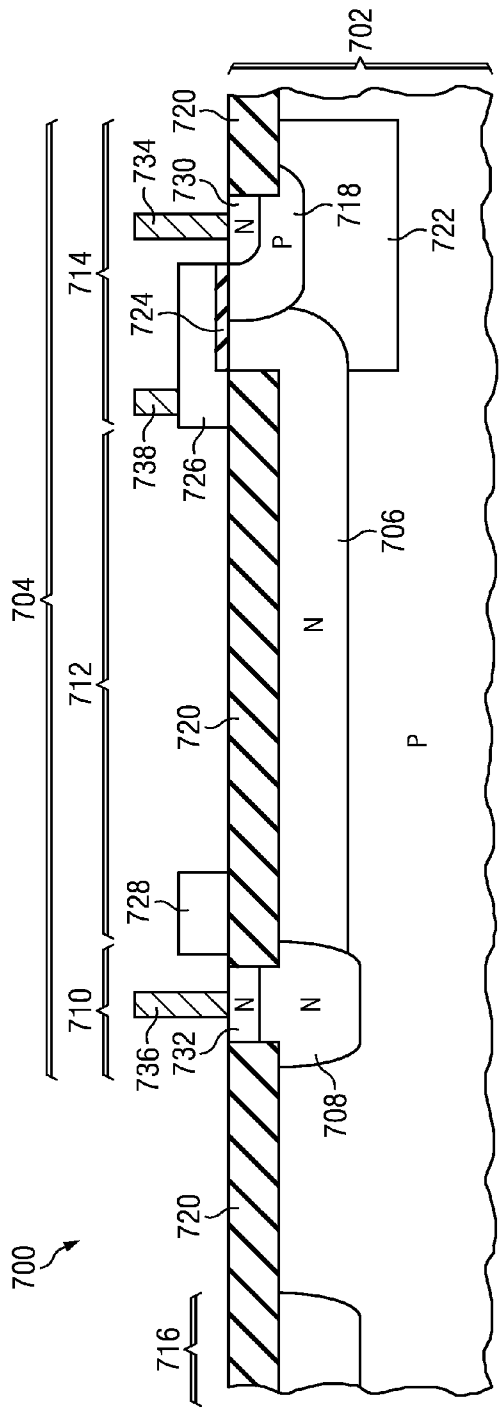
FIG. 7A and FIG. 7B are cross sections of an integrated circuit containing a power transistor integrated with a blocking transistor, as described in reference to FIG. 1 through FIG. 3, depicting elements of the blocking transistor and the power transistor.
Figure 7B:
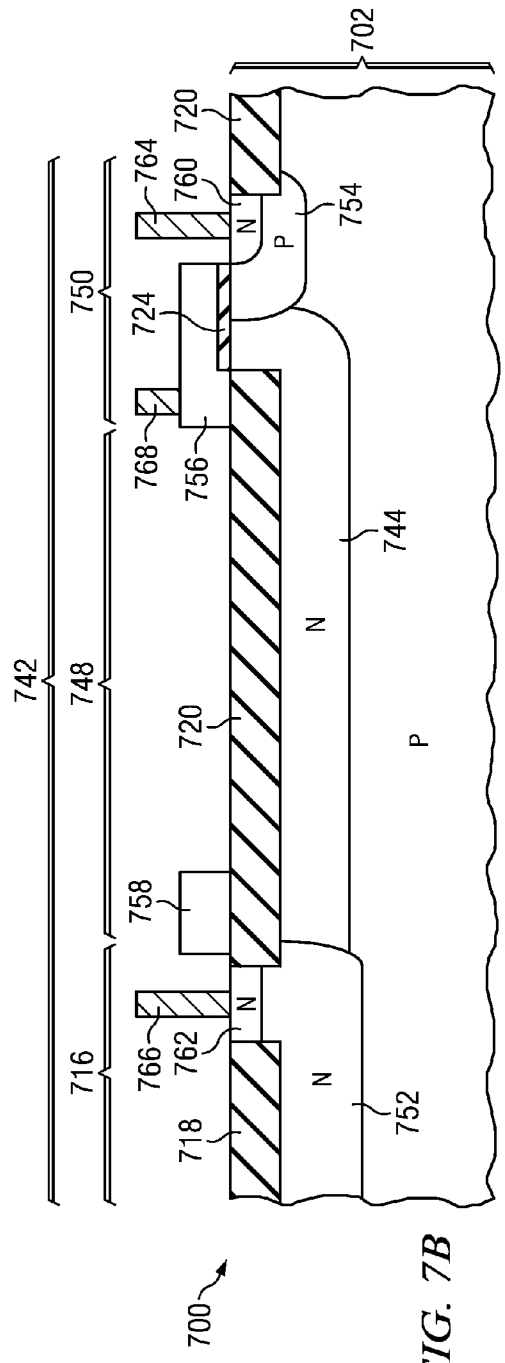

FIG. 7A and FIG. 7B are cross sections of an integrated circuit containing a power transistor integrated with a blocking transistor, as described in reference to FIG. 1 through FIG. 3, depicting elements of the blocking transistor and the power transistor. Referring to FIG. 7A, the integrated circuit 700 is formed in and on a p-type semiconductor substrate 702 which may be, for example, a single crystal silicon wafer, possibly with an epitaxial layer, a silicon-on-insulator (SOI) wafer, a hybrid orientation technology (HOT) wafer with regions of different crystal orientations, or other material appropriate for fabrication of the integrated circuit 700. The blocking transistor 704 includes an n-type drift layer 706 including one or more RESURF layers, disposed in the substrate 702. The drift layer 706 extends from a drain area 710 through a drift area 712 to a channel/source area 714 of the blocking transistor 704. An n-type drain drift layer connecting well 708 may be disposed in the drain area 710 so as to make electrical connection to the drift layer 706. The blocking transistor drain area 710 is proximate to a power transistor drain area 716. The blocking transistor drain area 710 is separated from the power transistor drain area 716 by semiconductor material of the substrate 702.

A p-type body 718 is disposed in the substrate 702 in the channel/source area 714 abutting the drift layer 706. Field oxide 720 is disposed at a top surface of the substrate 702 in the drift area 712 and laterally isolating the drain area 710 and the channel/source area 714. The body 718 is electrically isolated from the substrate 702 by a body isolation structure 722, possibly contacting the field oxide 720. The body isolation structure 722 may include, for example, an extension of the drift layer 706, a deep n-type well, an n-type buried layer, and/or a dielectric deep trench isolation structure.

A gate dielectric layer 724 is disposed at the top surface of the substrate 702, overlapping the body 718 and the drift layer 706 in the channel/source area 714. A gate 726 is disposed over the gate dielectric layer 724 in the channel/source area 714. An optional field plate 728 is disposed over the field oxide 720 overlapping a boundary of the drift layer 706 in the drain area 710. The field plate 728 may be formed concurrently with the gate 726.

An n-type source 730 is disposed in the body 718 adjacent to the gate 726. An n-type drain contact region 732 is disposed at the top surface of the substrate 702 in the drain area 710, so as to make electrical contact with the drift layer 706. Optional metal silicide, not shown, may be disposed over the source 730, the drain contact region 732 and possibly the gate 726.

A source contact 734 is disposed so as to make electrical connection to the source 730, through the metal silicide, if present. A drain contact 736 is disposed so as to make electrical connection to the drain contact region 732, through the metal silicide, if present. A gate contact 738 is disposed so as to make electrical connection to the gate 726, through the metal silicide, if present.

Referring to FIG. 7B, the power transistor 742 includes an n-type drift layer 744 including one or more RESURF layers, disposed in the substrate 702. The drift layer 744 extends from the drain area 716 through a drift area 748 to a channel/source area 750 of the power transistor 742. An n-type drain drift layer connecting well 752 may be disposed in the drain area 716 so as to make electrical connection to the drift layer 744.

A p-type body 754 is disposed in the substrate 702 in the channel/source area 750 abutting the drift layer 744. Field oxide 720 laterally isolates the drain area 716 and the channel/source area 750. The body 754 is directly electrically connected to the substrate 702.

The gate dielectric layer 724 overlaps the body 754 and the drift layer 744 in the channel/source area 750. A gate 756 is disposed over the gate dielectric layer 724 in the channel/source area 750. An optional field plate 758 is disposed over the field oxide 720 overlapping a boundary of the drift layer 744 in the drain area 716. The field plate 758 may be formed concurrently with the gate 756.

An n-type source 760 is disposed in the body 754 adjacent to the gate 756. An n-type drain contact region 762 is disposed at the top surface of the substrate 702 in the drain area 716, so as to make electrical contact with the drift layer 744. The power transistor drain contact region 762 is separated from the blocking transistor drain contact region 732 by field oxide 720. The optional metal silicide, not shown, may be disposed over the source 760, the drain contact region 762 and possibly the gate 756.

A source contact 764 is disposed so as to make electrical connection to the source 760, through the metal silicide, if present. A drain contact 766 is disposed so as to make electrical connection to the drain contact region 762, through the metal silicide, if present. A gate contact 768 is disposed so as to make electrical connection to the gate 756, through the metal silicide, if present. In the instant embodiment, the power transistor drain contact 766 is separate from the blocking transistor drain contact 736. The blocking transistor drain contact region 732 in the blocking transistor drain area 710 is electrically coupled to the power transistor drain contact region 762 in the power transistor drain area 716 through metal interconnects, not shown, of the integrated circuit 700, possibly including through a current sense resistor.

Figure 8A:
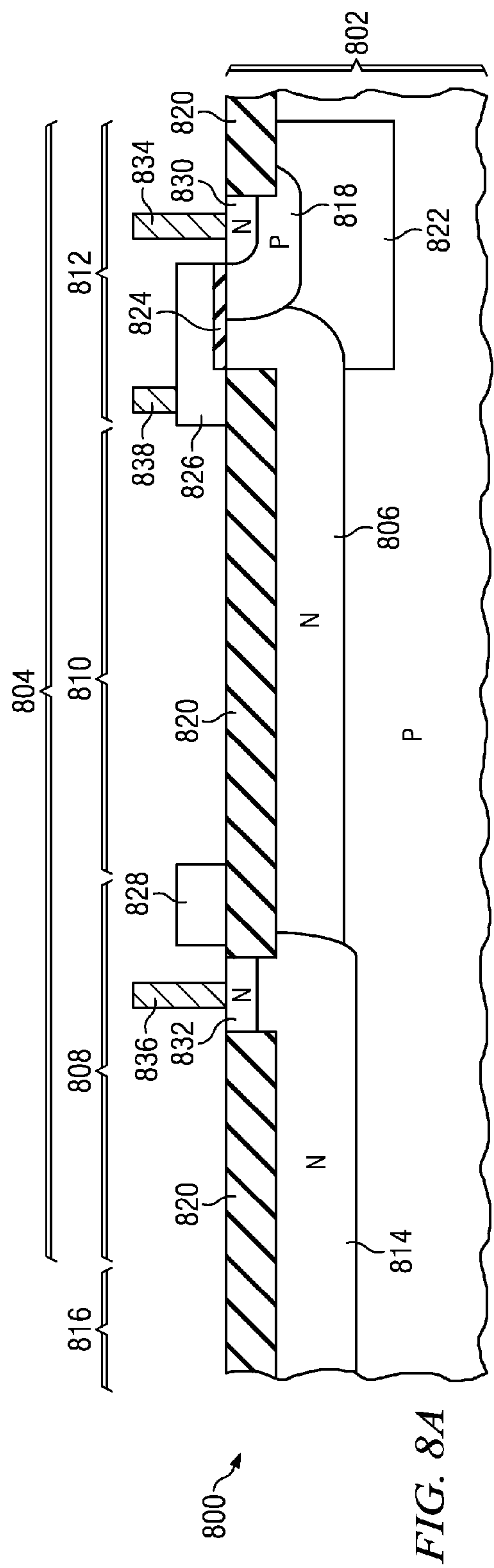
FIG. 8A and FIG. 8B are cross sections of an integrated circuit containing a power transistor integrated with a blocking transistor, as described in reference to FIG. 4 through FIG. 6, depicting elements of the blocking transistor and the power transistor.
Figure 8B:
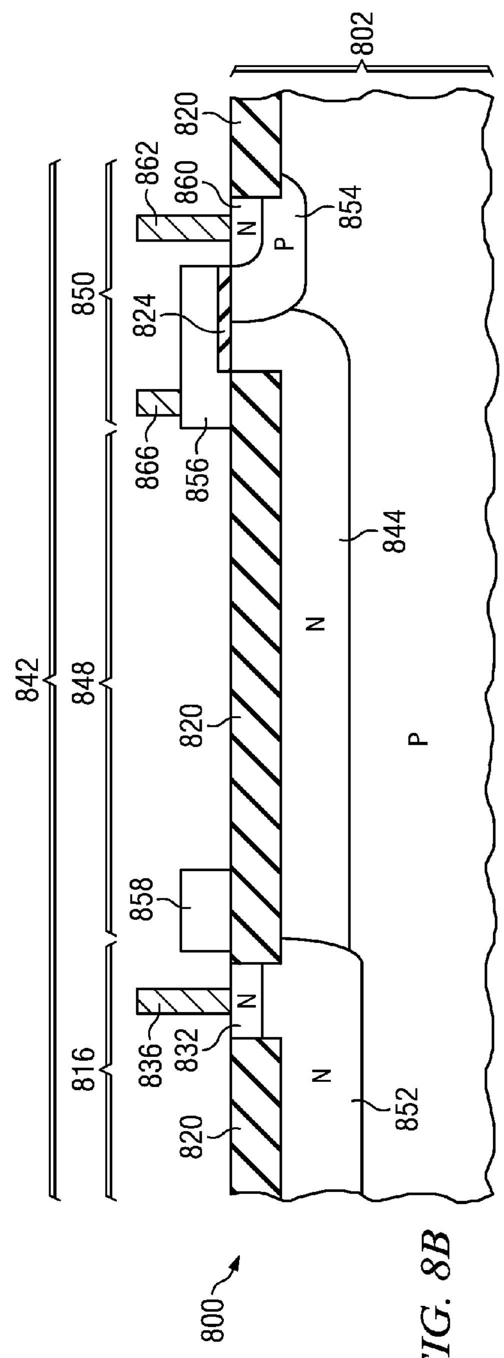

FIG. 8A and FIG. 8B are cross sections of an integrated circuit containing a power transistor integrated with a blocking transistor, as described in reference to FIG. 4 through FIG. 6, depicting elements of the blocking transistor and the power transistor. Referring to FIG. 8A, the integrated circuit 800 is formed in and on a p-type semiconductor substrate 802 as described in reference to FIG. 7A. The blocking transistor 804 includes an n-type drift layer 806 including one or more RESURF layers, disposed in the substrate 802. The drift layer 806 extends from a drain area 808 through a drift area 810 to a channel/source area 812 of the blocking transistor 804. An n-type drain drift layer connecting well 814 may be disposed in the drain area 808 so as to make electrical connection to the drift layer 806. The blocking transistor drain area 808 is contiguous with a power transistor drain area 816.

A p-type body 818 is disposed in the substrate 802 in the channel/source area 812 abutting the drift layer 806. Field oxide 820 is disposed at a top surface of the substrate 802 in the drift area 810 and laterally isolating the drain area 808 and the channel/source area 812. The body 818 is electrically isolated from the substrate 802 by a body isolation structure 822, as described in reference to FIG. 7A.

A gate dielectric layer 824, a gate 826 and an optional field plate 828 are disposed in the blocking transistor 804 as described in reference to FIG. 7A. An n-type source 830 and an n-type drain contact region 832 are disposed in the blocking transistor 804 as described in reference to FIG. 7A.

A source contact 834 is disposed so as to make electrical connection to the source 830, through optional metal silicide, if present. A drain contact 836 is disposed so as to make electrical connection to the drain contact region 832, through the metal silicide, if present. A gate contact 838 is disposed so as to make electrical connection to the gate 826, through the metal silicide, if present.

Referring to FIG. 8B, the power transistor 842 includes an n-type drift layer 844 including one or more RESURF layers, disposed in the substrate 802. The drift layer 844 extends from the drain area 816 through a drift area 848 to a channel/source area 850 of the power transistor 842. An n-type drain drift layer connecting well 852 may be disposed in the drain area 816 so as to make electrical connection to the drift layer 844.

A p-type body 854 is disposed in the substrate 802 in the channel/source area 850 abutting the drift layer 844. Field oxide 820 laterally isolates the drain area 816 and the channel/source area 850. The body 854 is directly electrically connected to the substrate 802.

The gate dielectric layer 824 overlaps the body 854 and the drift layer 844 in the channel/source area 850. A gate 856 is disposed over the gate dielectric layer 824 in the channel/source area 850. An optional field plate 858 is disposed over the field oxide 820 overlapping a boundary of the drift layer 844 in the drain area 816. The field plate 858 may be formed concurrently with the gate 856.

An n-type source 860 is disposed in the body 854 adjacent to the gate 856. The n-type drain contact region 832 is disposed at the top surface of the substrate 802 in the drain area 816, so as to make electrical contact with the drift layer 844. In one version of the instant embodiment, the drain contact region 832 may extend contiguously into the blocking transistor drain area 808 and the power transistor drain area 816, so that the drain contact region 832 in the blocking transistor drain area 808 is electrically connected to the drain contact region 832 in the power transistor drain area 816 through the drain contact region 832. In another version, instances of the drain contact region 832 in the blocking transistor drain area 808 and the power transistor drain area 816 may be laterally isolated by field oxide 820 while the power transistor drain drift layer connecting well 852 contacts the blocking transistor drain drift layer connecting well 814, so that the drain contact region 832 in the blocking transistor drain area 808 is electrically connected to the drain contact region 832 in the power transistor drain area 816 through n-type doped regions in the substrate 802 such as the blocking transistor drain drift layer connecting well 814 and the power transistor drain drift layer connecting well 852. The optional metal silicide, not shown, may be disposed over the source 860, the drain contact region 832 and possibly the gate 856.

A source contact 862 is disposed so as to make electrical connection to the source 860, through the metal silicide, if present. A drain contact 864 is disposed so as to make electrical connection to the drain contact region 832, through the metal silicide, if present. An instance of the drain contact 836 may be disposed in the power transistor drain area 816. A gate contact 866 is disposed so as to make electrical connection to the gate 856, through the metal silicide, if present.

Figure 9A:
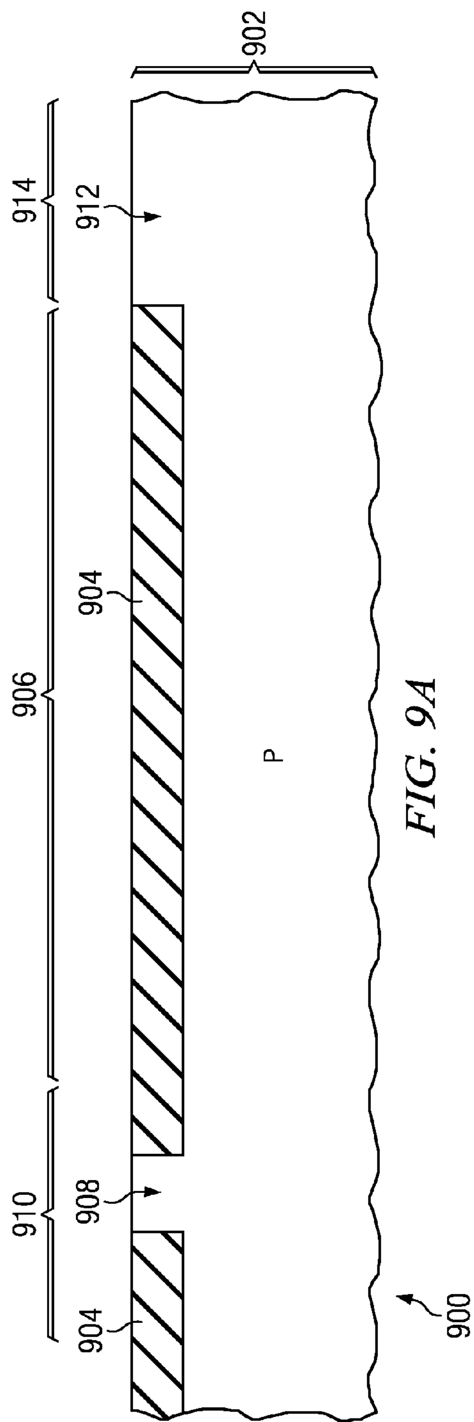
FIG. 9A and FIG. 9B are cross sections of an integrated circuit containing a power transistor integrated with a blocking transistor, formed according to an embodiment, depicting a blocking transistor drift layer and/or a power transistor drift layer in successive stages of fabrication.
Figure 9B:
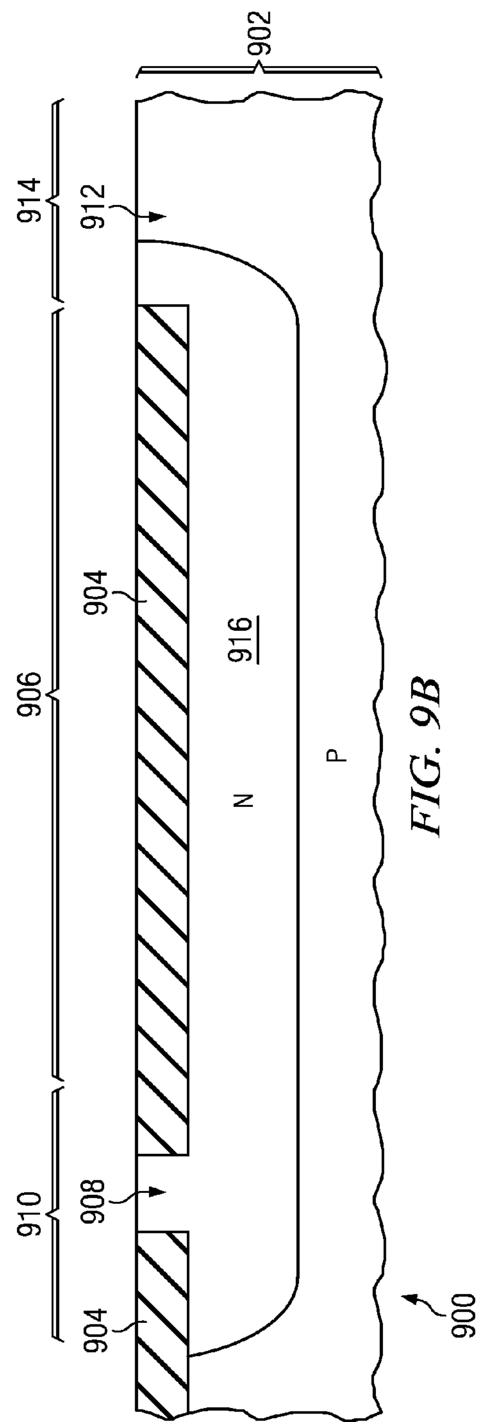

FIG. 9A and FIG. 9B depict successive stages of fabrication of a blocking transistor drift layer and/or a power transistor drift layer in a power transistor integrated with a blocking transistor. Referring to FIG. 9A, an integrated circuit 900 is formed in and on a semiconductor substrate 902 as described in reference to FIG. 7A. Field oxide 904 is formed at a top surface of the substrate 902 in a drift area 906, with a drain contact opening 908 in a drain area 910 and a channel/source opening 912 in a channel/source area 914. The field oxide 904 may be, for example, silicon dioxide between 350 and 600 nanometers thick, formed by shallow trench isolation (STI) or local oxidation of silicon (LOCOS) processes. In STI processes, silicon dioxide may be deposited by high density plasma (HDP) or high aspect ratio process (HARP).

Referring to FIG. 9B, an n-type drift layer 916 is formed in the substrate 902 under the field oxide 904 in the drift area 906. In the instant embodiment, the drift layer 916 contacts a bottom surface of the field oxide 904. The drift layer 916 may be formed, for example, by ion implanting n-type dopants such as phosphorus at a dose between $3\times10^{11}$ atoms/cm$^2$ and $3\times10^{12}$ atoms/cm$^2$, followed by an anneal operation which heats the substrate 902 above 1000° C. in an anneal furnace so as to activate the n-type dopants. A depth of the drift layer 916 may be between 1 and 3 microns. In one version of the instant embodiment, the drift layer 916 may extend to the top surface of the substrate 902 in the drain contact opening 908 and the channel/source opening 912 as depicted in FIG. 9B. In another version, the drift layer 916 may not necessarily extend to the top surface of the substrate 902.

Figure 10A:
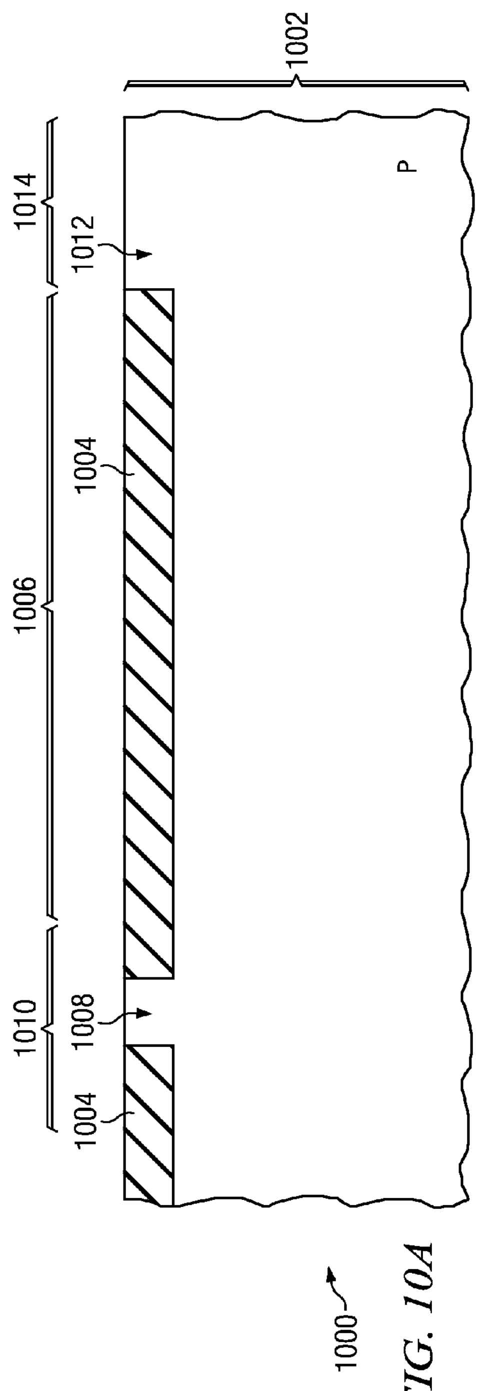
FIG. 10A through FIG. 10C are cross sections of an integrated circuit containing a power transistor integrated with a blocking transistor, formed according to another embodiment, depicting a blocking transistor drift layer and/or a power transistor drift layer in successive stages of fabrication.
Figure 10B:
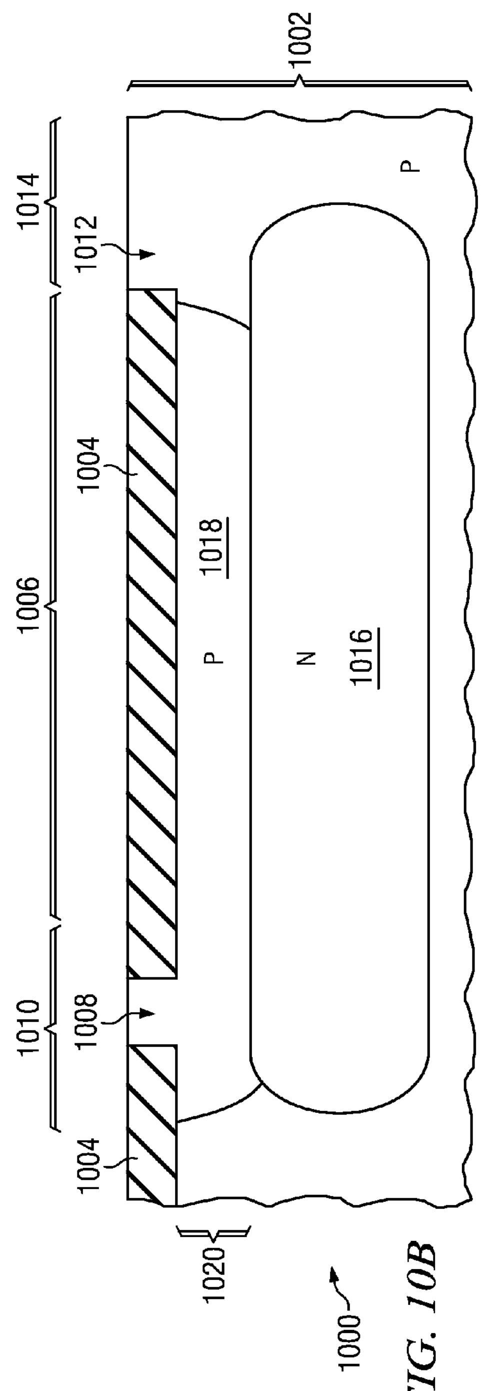
Figure 10C:
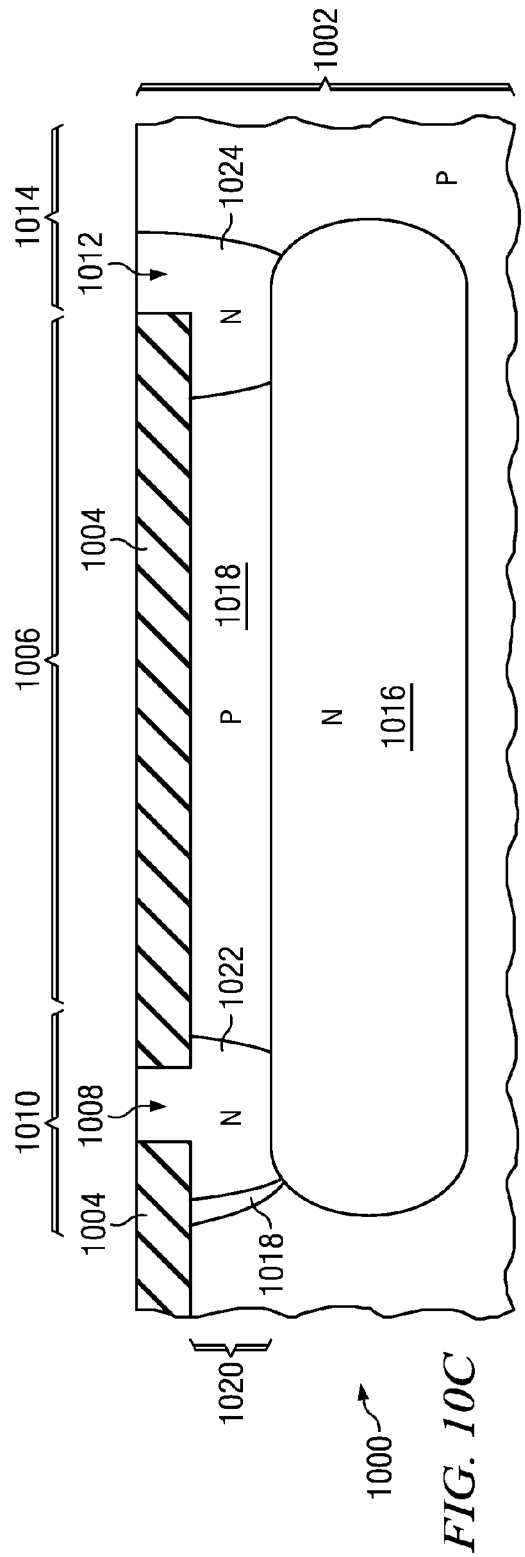

FIG. 10A through FIG. 10C depict successive stages of fabrication of a blocking transistor drift layer and/or a power transistor drift layer in a power transistor integrated with a blocking transistor. Referring to FIG. 10A, an integrated circuit 1000 is formed in and on a p-type semiconductor substrate 1002 as described in reference to FIG. 7A. Field oxide 1004 is formed at a top surface of the substrate 1002 in a drift area 1006, with a drain contact opening 1008 in a drain area 1010 and a channel/source opening 1012 in a channel/source area 1014. The field oxide 1004 may be formed as described in reference to FIG. 9A.

Referring to FIG. 10B, an n-type buried double-sided RESURF drift layer 1016 is formed under the field oxide 1004 in the drift area 1006, for example by ion implanting n-type dopants at a dose between $6\times10^{11}$ atoms/cm$^2$ and $6\times10^{12}$ atoms/cm$^2$, followed by an anneal operation as described in reference to FIG. 9A. In one version of the instant embodiment, the drift layer 1016 may be between 1 and 3 microns thick. In the instant embodiment, a top surface of the drift layer 1016 is at least 500 nanometers below a bottom surface of the field oxide 1004. An optional p-type upper RESURF augmentation layer 1018 may be formed between the field oxide 1004 and the drift layer 1016, for example by ion implanting p-type dopants such as boron through the field oxide 1004. P-type material between the field oxide 1004 and the drift layer 1016, including the optional p-type upper RESURF augmentation layer 1018 if formed, provides an upper RESURF layer 1020. A vertically cumulative doping density of the upper RESURF layer 1020 is between $3\times10^{11}$ atoms/cm$^2$ and $3\times10^{12}$ atoms/cm$^2$.

Referring to FIG. 10C, an n-type drain connecting region 1022 is formed in the substrate 1002 at the drain contact opening 1008 extending through the upper RESURF layer 1020 to the drift layer 1016. The drain connecting region 1022 may be formed, for example, by ion implanting n-type dopants such as phosphorus into the substrate 1002 at a dose between $1\times10^{15}$ atoms/cm$^2$ and $3\times10^{16}$ atoms/cm$^2$. The drain connecting region 1022 provides an electrical connection to the drift layer 1016. An n-type channel connecting region 1024 is formed in the substrate 1002 at the channel/source area 1014 extending through the upper RESURF layer 1020 to the drift layer 1016. The channel connecting region 1024 may be formed, for example, by ion implanting n-type dopants such as phosphorus into the substrate 1002 at a dose between $1\times10^{15}$ atoms/cm$^2$ and $3\times10^{16}$ atoms/cm$^2$ and may be formed concurrently with the drain connecting region 1022. The channel connecting region 1024 provides an electrical connection to a channel layer in the channel/source area 1014.

Figure 11A:
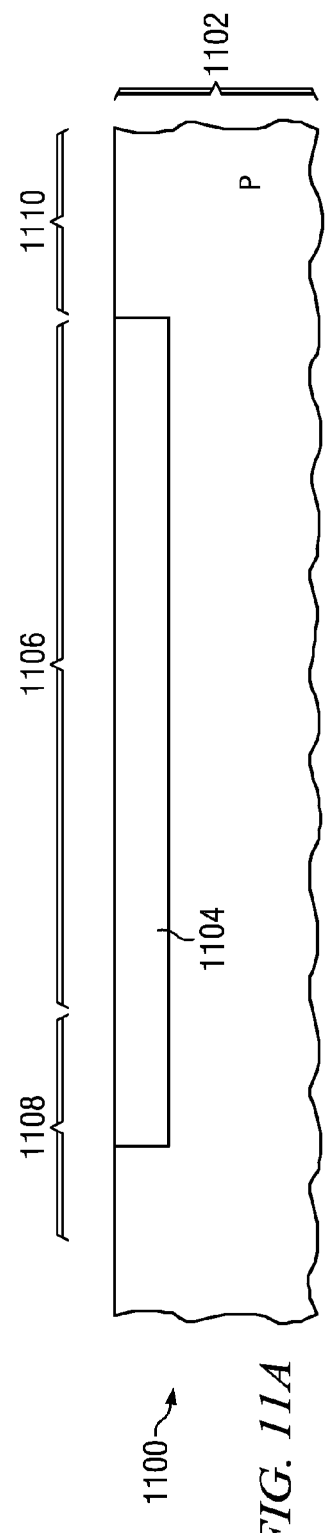
FIG. 11A through FIG. 11D are cross sections of an integrated circuit containing a power transistor integrated with a blocking transistor, formed according to a further embodiment, depicting a blocking transistor drift layer and/or a power transistor drift layer in successive stages of fabrication.

FIG. 11A through FIG. 11D are cross sections of an integrated circuit containing a power transistor integrated with a blocking transistor, formed according to a further embodiment, depicting a blocking transistor drift layer and/or a power transistor drift layer in successive stages of fabrication. Referring to FIG. 11A, the integrated circuit 1100 is formed in and on a p-type semiconductor base substrate 1102, such as a single crystal silicon wafer. An n-type buried drift layer implanted region 1104 is formed in the base substrate 1102 in a drift area 1106 extending to a drain area 1108 and a channel/source area 1110 opposite the drain area 1108, for example by ion implanting n-type dopants such as phosphorus at a dose between $6\times10^{11}$ atoms/cm$^2$ and $6\times10^{12}$ atoms/cm$^2$.

Figure 11B:
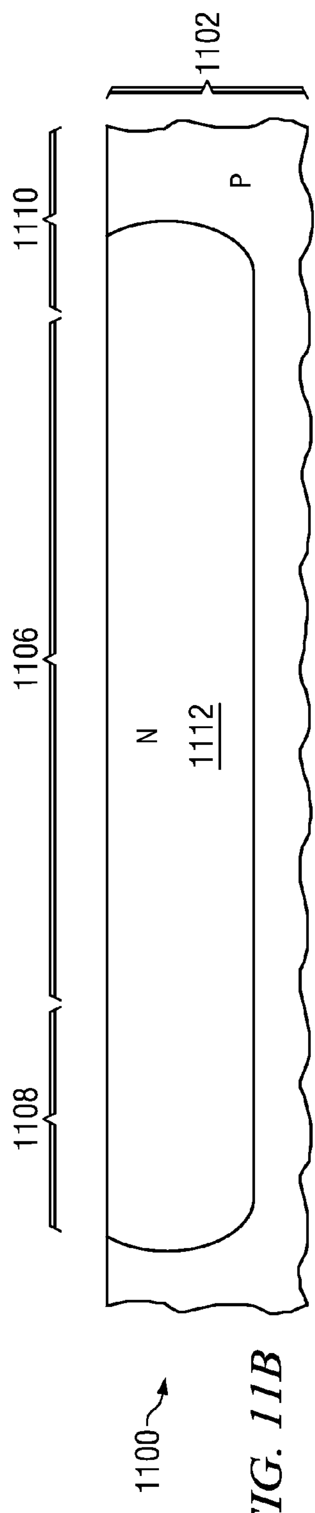

Referring to FIG. 11B, a thermal drive process is performed on the base substrate 1102 which heats the base substrate 1102 above 1000° C. in an anneal furnace for at least 30 minutes, causing the dopants in the buried drift layer implanted region 1104 to diffuse outward and become activated, forming a buried drift layer 1112. In one version of the instant embodiment, the drift layer 1112 is between 2 and 4 microns thick.

Figure 11C:
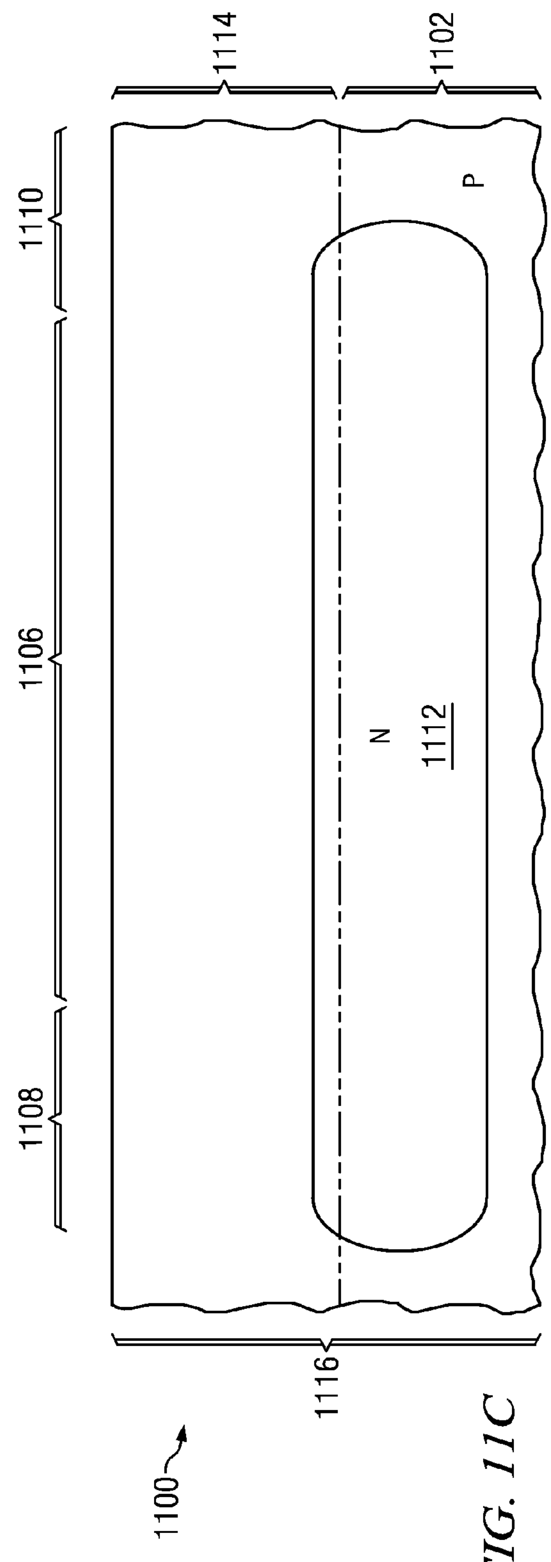

Referring to FIG. 11C, an epitaxial growth process is performed on the base substrate 1102 which forms a p-type epitaxial layer 1114 on the base substrate 1102. In one version of the instant embodiment, the epitaxial layer 1114 may be between 1 and 3 microns thick. The drift layer 1112 may expand into the epitaxial layer 1114 during the epitaxial growth process, as depicted in FIG. 11C. A combination of the base substrate 1102 and epitaxial layer 1114 forms a substrate 1116 for the integrated circuit 1100.

Figure 11D:
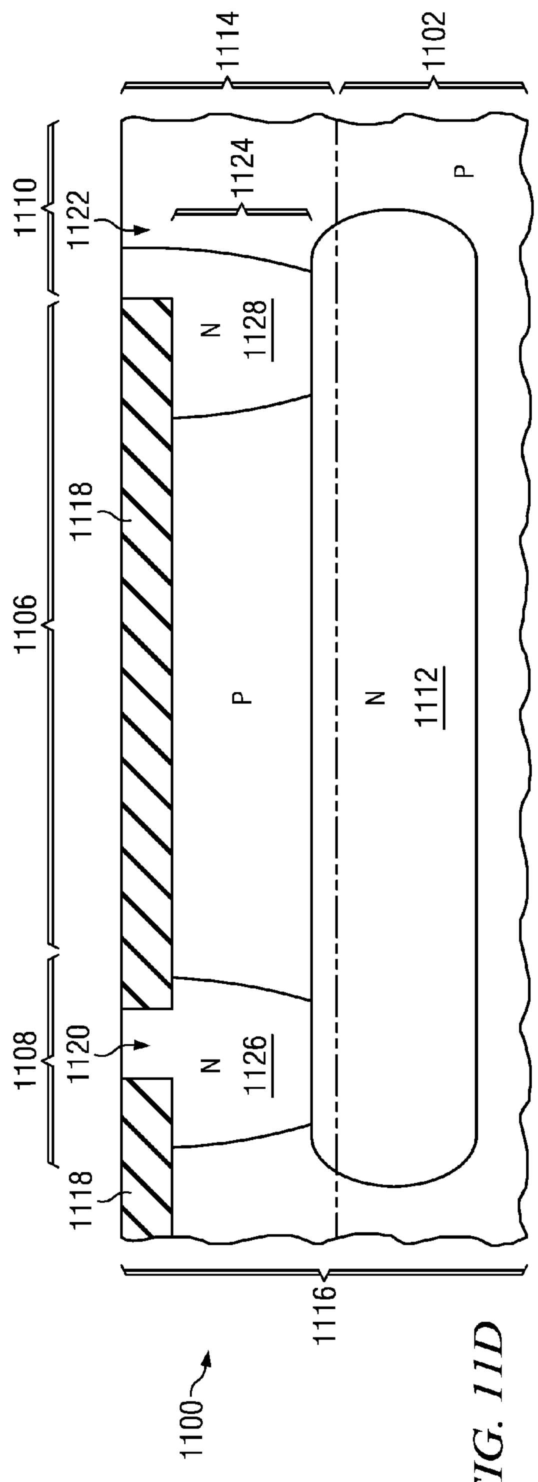

Referring to FIG. 11D, field oxide 1118 is formed in the drift area 1106, with a drain contact opening 1120 in the drain area 1108 and a channel/source opening 1122 in a channel/source area 1110. A top surface of the drift layer 1112 is at least 1 micron below a bottom surface of the field oxide 1118. An optional p-type upper RESURF augmentation layer, not shown, may be formed between the field oxide 1118 and the drift layer 1112, as described in reference to FIG. 10B. P-type material between the field oxide 1118 and the drift layer 1112, including the optional p-type upper RESURF augmentation layer if formed, provides a upper RESURF layer 1124. A vertically cumulative doping density of the upper RESURF layer 1124 is between $3\times10^{11}$ atoms/cm$^2$ and $3\times10^{12}$ atoms/cm$^2$. An n-type connecting region 1126 is formed in the substrate 8010 at the central opening 8014 extending through the upper RESURF layer 1124 to the drift layer 1112, as described in reference to FIG. 10C. An n-type channel connecting region 1128 is formed in the substrate 1116 at the channel/source area 1110 extending through the upper RESURF layer 1124 to the drift layer 1112. The channel connecting region 1128 may be formed as described in reference to FIG. 10C and may be formed concurrently with the drain connecting region 1126. The channel connecting region 1128 provides an electrical connection to a channel layer in the channel/source area 1110.

Figure 12A:
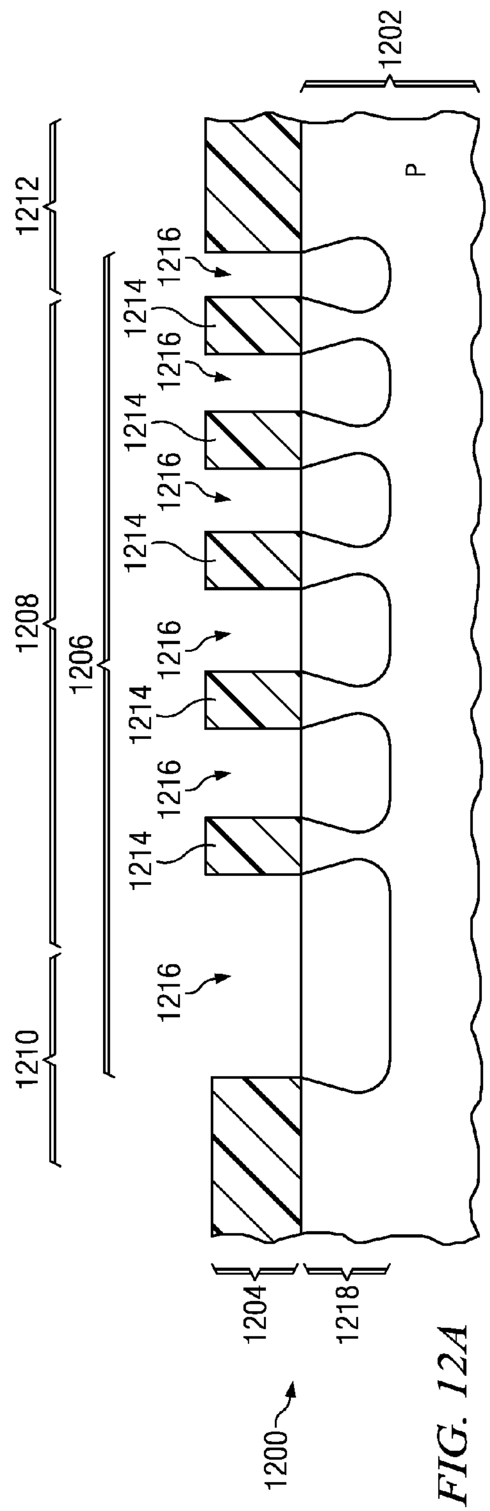
FIG. 12A through FIG. 12C are cross sections of an integrated circuit containing a power transistor integrated with a blocking transistor, formed according to another embodiment, depicting a blocking transistor drift layer and/or a power transistor drift layer in successive stages of fabrication.
Figure 12B:
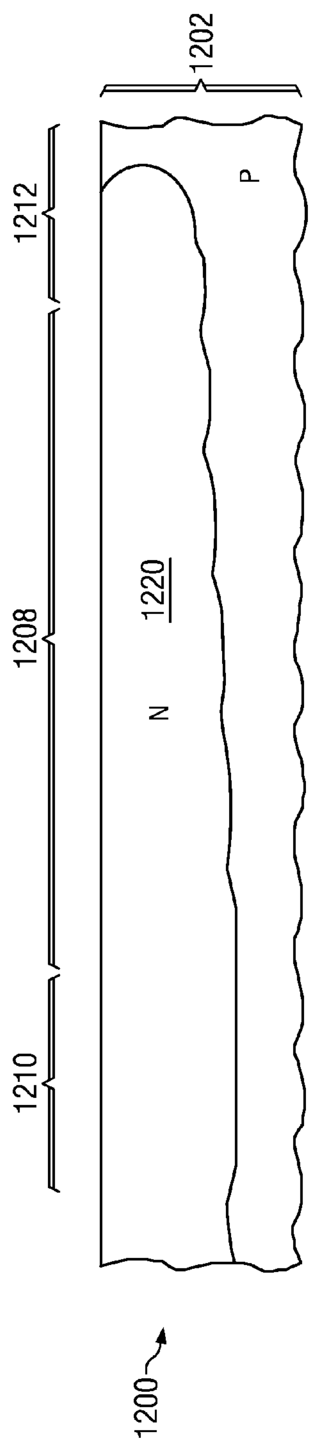
Figure 12C:
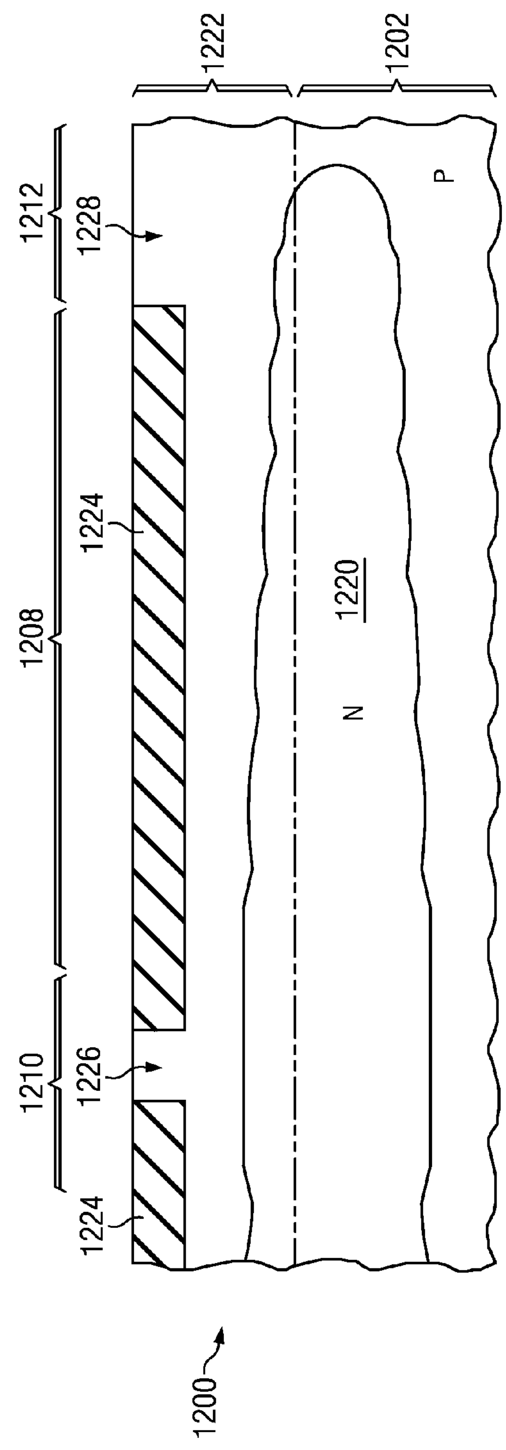

FIG. 12A through FIG. 12C are cross sections of an integrated circuit containing a power transistor integrated with a blocking transistor, formed according to another embodiment, depicting a blocking transistor drift layer and/or a power transistor drift layer in successive stages of fabrication. Referring to FIG. 12A, the integrated circuit 1200 is formed in and on a p-type semiconductor base substrate 1202 as described in reference to FIG. 11A. A segmented, graded drift layer implant mask 1204 is formed over the base substrate 1202 so as to expose an area 1206 for ion implanting n-type dopants to form a segmented, graded n-type drift layer. The exposed area 1206 is disposed in a drift area 1208 extending to a drain area 1210 and a channel/source area 1212 opposite the drain area 1210. The drift layer implant mask 1204 includes segmenting elements 1214 in the ion implant area 1206. In one version of the instant embodiment, the drift layer implant mask 1204 may include photoresist, for example between 0.3 and 1 microns thick. In another version, the drift layer implant mask 1204 may be formed of dielectric material such as silicon dioxide and/or silicon nitride by depositing one or more layers of the dielectric materials over the base substrate 1202, forming a photoresist pattern over the dielectric layers to cover areas of the drift layer implant mask 1204, and removing unwanted dielectric material from the dielectric layers using the photoresist pattern as an etch mask, so as to leave dielectric material under the photoresist pattern to form the drift layer implant mask 1204. The segmenting elements 1214 may be substantially equal in size as depicted in FIG. 12A or may be of varying size. The segmenting elements 1214 may be of any shape and/or orientation, such as radially oriented tapered trapezoids, nested arcs or round pillars. Open areas 1216 in the drift layer implant mask 1204 may be of sequentially increasing size as depicted in FIG. 12A, or may be substantially equal in size.

A drift layer ion implant operation is performed on the integrated circuit 1200 which implants n-type dopants such as phosphorus into the base substrate 1202 through the open areas 1216 of the drift layer implant mask 1204 to form a segmented, graded drift layer implanted region 1218. The term "segmented" in the description of the drift layer implanted region 1218 denotes that the drift layer implanted region 1218 is spatially segmented as a result of implanting the dopants through open areas 1216 defined by the segmenting elements 1214. The term "graded" in the description of the drift layer implanted region 1218 denotes that the drift layer implanted region 1218 has a lateral gradient in an average density of the implant dopants, resulting from the open areas 1216 sequentially increasing in size, and/or from the segmenting elements 1214 sequentially decreasing in size. In an alternate version of the instant embodiment, the drift layer implanted region 1218 may be segmented, but not necessarily graded, so that implanted segments of the drift layer implanted region 1218 are substantially equal in size and spacing.

Referring to FIG. 12B, an anneal operation is performed on the base substrate 9002 which heats the base substrate 1202 above 1000° C. in an anneal furnace for at least 30 minutes, causing the dopants in the drift layer implanted region 1218 to diffuse outward and become activated, forming a segmented, graded drift layer 1220. The term "segmented" in the description of the drift layer 1220 denotes that the drift layer 1220 was formed from a segmented implanted region. The term "graded" in the description of the drift layer 1220 denotes that the drift layer 1220 has a lateral gradient in an average density of the implant dopants, resulting from formation from a graded implanted layer. In one version of the instant embodiment, the drift layer 1220 may be segmented but not necessarily graded.

Referring to FIG. 12C, a p-type epitaxial layer 1222 is formed on the base substrate 1202, as described in reference to FIG. 11C. The drift layer 1220 extends into the epitaxial layer 1222 as shown in FIG. 12C, so as to form a double-sided RESURF drift layer with laterally graded doping density. Field oxide 1224 is subsequently formed over the drift layer 1220 at a top surface of the epitaxial layer 1222 with a drain contact opening 1226 in the drain area 1210 and a channel/source opening 1228 in a channel/source area 1212. In one version of the instant embodiment, not depicted in FIG. 12C, one or more of the implanted segments of the drift layer 1220 may not contact other implanted segments of the drift layer 1220 after the epitaxial layer 1222 is formed; during operation of the integrated circuit 1200, depletion regions from the segments of the drift layer 1220 overlap. Fabrication of the integrated circuit 1200 is continued as described in reference to FIG. 11D.

Figure 13:
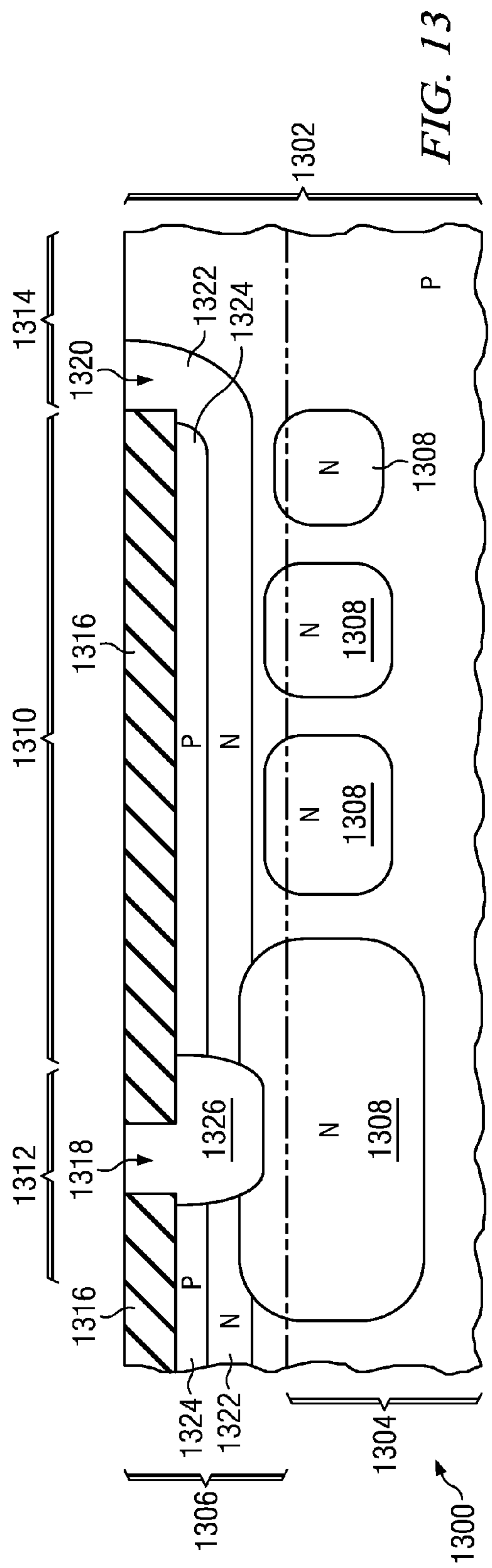
FIG. 13 is a cross section of an integrated circuit containing a power transistor integrated with a blocking transistor, formed according to a further embodiment, depicting a blocking transistor drift layer and/or a power transistor drift layer.

FIG. 13 is a cross section of an integrated circuit containing a power transistor integrated with a blocking transistor, formed according to a further embodiment, depicting a blocking transistor drift layer and/or a power transistor drift layer. The integrated circuit 1300 is formed in and on a semiconductor substrate 1302 which includes a p-type base substrate 1304 and a p-type epitaxial layer 1306. An n-type segmented and graded buried lower drift layer 1308 is formed in the base substrate 1304 and extends into the epitaxial layer 1306. The drift layer 1308 is disposed in a drift area 1310 extending to a drain area 1312 and a channel/source area 1314 opposite the drain area 1312. In one version of the instant embodiment, the drift layer 1308 may include one or more disconnected segments, as depicted in FIG. 13; during operation of the integrated circuit 1300, depletion regions from the segments of the drift layer 1308 overlap.

Field oxide 1316 is formed at a top surface of the epitaxial layer 1306 over the lower drift layer 1308 with a drain contact opening 1318 in the drain area 1312 and a channel/source opening 1320 in a channel/source area 1314. An n-type upper drift layer 1322 is formed in the epitaxial layer 1306 so as to contact the lower drift layer 1308 under the drain contact opening 1318 and so as to be separated from the lower drift layer 1308 by a p-type region of the epitaxial layer 1306 in the drift area 1310 and in the channel/source area 1314. A p-type upper RESURF layer 1324 is formed in the epitaxial layer 1306 between the field oxide 1316 and the upper drift layer 1322. An n-type connecting region 1326 is formed in the epitaxial layer 1306 at the drain contact opening 1318 extending through the upper RESURF layer 1324 to the upper drift layer 1322 and the lower drift layer 1308.

Figure 14:
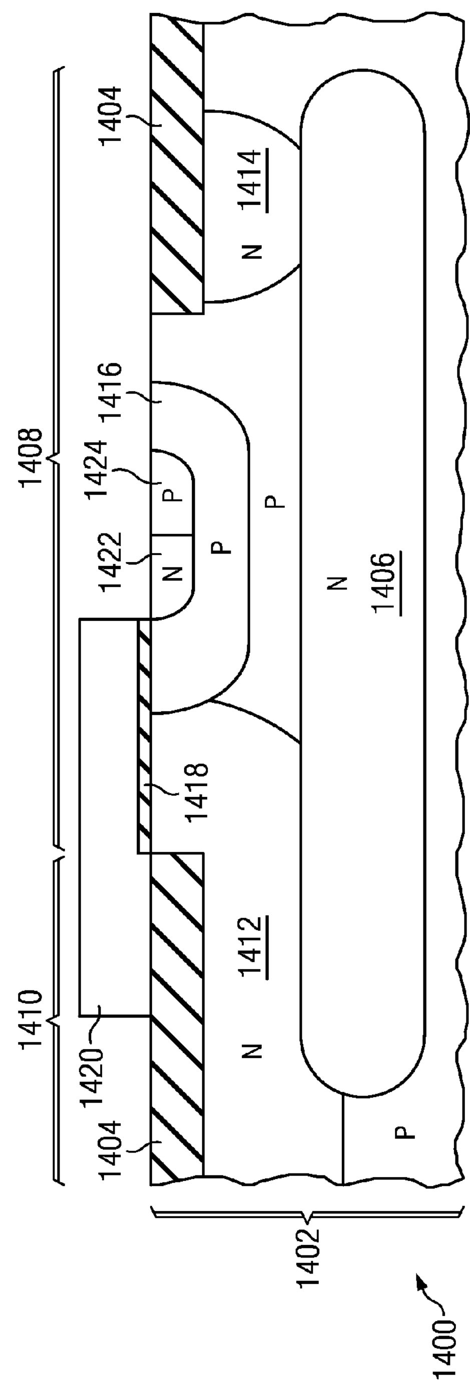
FIG. 14 through FIG. 16 are cross-sections of integrated circuits containing a power transistor integrated with a blocking transistor, formed according to embodiments, depicting examples of body isolation structures of the blocking transistors.
Figure 15:
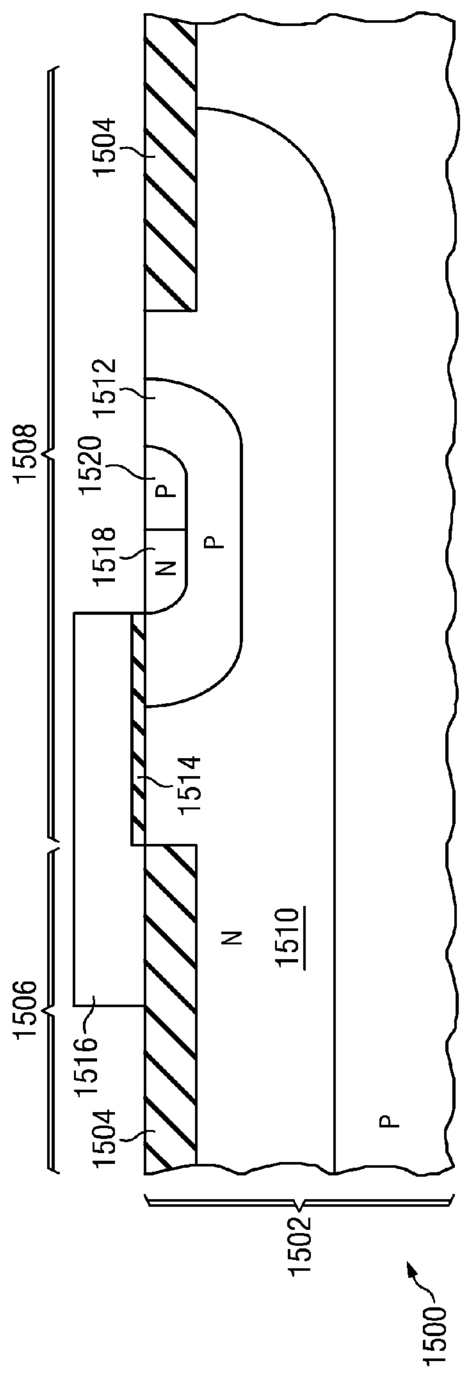
Figure 16:
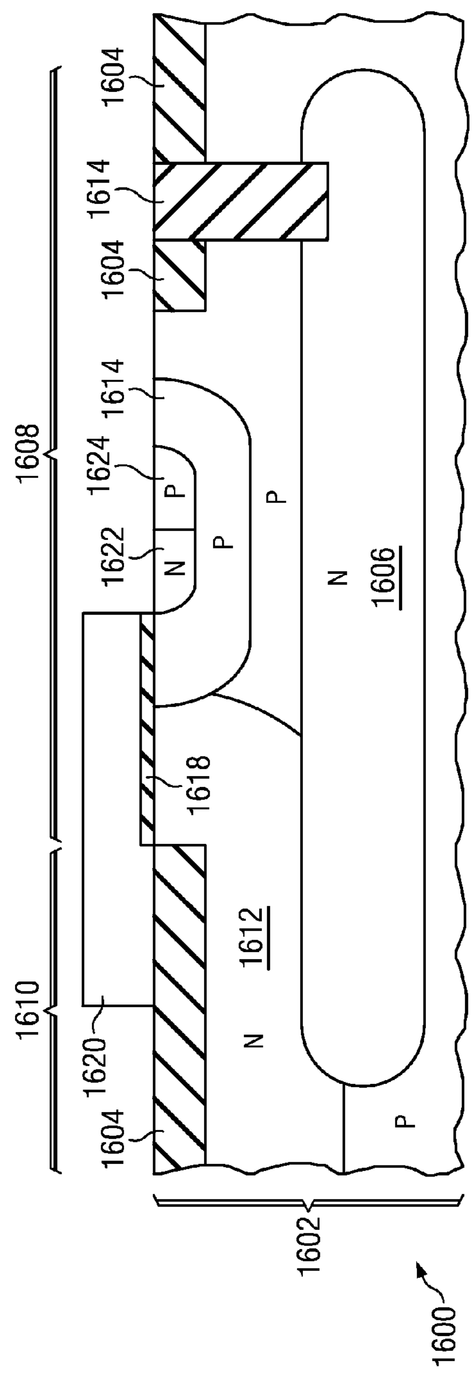

FIG. 14 through FIG. 16 are cross-sections of integrated circuits containing a power transistor integrated with a blocking transistor, formed according to embodiments, depicting examples of body isolation structures of the blocking transistors. Referring to FIG. 14, an integrated circuit 1400 is formed in and on a p-type semiconductor substrate 1402 as described in reference to FIG. 7A. Field oxide 1404 is disposed at a top surface of the substrate 1402 in a drift area 1410 with an opening in a channel/source area 1408. An n-type buried layer 1406 is disposed in the substrate 1402 in the channel/source area 1408 and extending under the blocking transistor body 1416 and into the drift area 1410. The buried layer 1406 may be formed, for example, as described in reference to FIG. 11A through FIG. 11C. An n-type drift layer 1412 is disposed in the substrate 1402 in the drift area 1410, contacting the buried layer 1406. An n-type isolation barrier well 1414 is disposed in the substrate 1402 in the channel/source area 1408 surrounding a p-type body 1416 disposed in the channel/source area 1408. A gate dielectric layer 1418 and gate 1420 are disposed over the body 1416 and the drift layer 1412 in the channel/source area 1408. An n-type source 1422 is disposed in the body 1416 adjacent to the gate 1420, and a p-type body contact region 1424 is disposed in the body 1416. The field oxide 1404 and isolation barrier well 1414 combined with the drift layer 1412 laterally surround the body 1416 and connect to the buried layer 1406 so as to electrically isolate the body 1416 from the substrate 1402 outside the channel/source area 1408.

Referring to FIG. 15, an integrated circuit 1500 is formed in and on a p-type semiconductor substrate 1502 as described in reference to FIG. 7A. Field oxide 1504 is disposed at a top surface of the substrate 1502 in a drift area 1506 with an opening in a channel/source area 1508. An n-type drift layer 1510 is disposed in the substrate 1502 in the drift area 1506 and extending into the channel/source area 1508 under a p-type body 1512 disposed in the channel/source area 1508 and up to the field oxide 1504, so that the drift layer 1510 surrounds the body 1512 on all sides and on a bottom surface so that the drift layer 1510 electrically isolates the body 1512 from the substrate 1502 outside the channel/source area 1508. A gate dielectric layer 1514 and gate 1516 are disposed over the body 1512 and the drift layer 1510 in the channel/source area 1508. An n-type source 1518 is disposed in the body 1512 adjacent to the gate 1516, and a p-type body contact region 1520 is disposed in the body 1512.

Referring to FIG. 16, an integrated circuit 1600 is formed in and on a p-type semiconductor substrate 1602 as described in reference to FIG. 7A. Field oxide 1604 is disposed at a top surface of the substrate 1602 in a drift area 1610 with an opening in a channel/source area 1608. An n-type buried layer 1606 is disposed in the substrate 1602 in the channel/source area 1608 and extending into the drift area 1610, as described in reference to FIG. 14. An n-type drift layer 1612 is disposed in the substrate 1602 in the drift area 1610, contacting the buried layer 1606. An instance of deep trench isolation 1614 is disposed in the substrate 1602 in the channel/source area 1608 surrounding a p-type body 1616 disposed in the channel/source area 1608 and extending to the buried layer 1606. A gate dielectric layer 1618 and gate 1620 are disposed over the body 1616 and the drift layer 1612 in the channel/source area 1608. An n-type source 1622 is disposed in the body 1616 adjacent to the gate 1620, and a p-type body contact region 1624 is disposed in the body 1616. The field oxide 1604 and deep trench isolation 1614 combined with the drift layer 1612 laterally surround the body 1616 and connect to the buried layer 1606 so as to electrically isolate the body 1616 from the substrate 1602 outside the channel/source area 1608.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:

a substrate;

a high voltage power transistor integrated with a blocking transistor, wherein said high voltage power transistor comprises:

a first drain area including a first drain contact region;

a first drift region electrically coupled to the first drain contact region, wherein the first drift region surrounds the first drain area except at said blocking transistor;

a first channel/source area surrounding the first drift region; and a first body region in the first channel/source area, said first body region electrically connected to said substrate;

and wherein the blocking transistor comprises:

a second drain area including a second drain contact region electrically coupled to the first drain contact region;

a second drift region electrically coupled to the second drain contact region, wherein a boundary between the second drain area and the second drift region is aligned with a boundary between the first drain area and the first drift region;

a second channel/source area abutting the second drift region opposite the second drain area; and a second body region in the second channel/source region, wherein the second body region is electrically isolated from the substrate by a body isolation region.

2. The integrated circuit of claim 1, in which said second drift region is separated from said first drift region by semiconductor material of said substrate from said second drain area to said first channel/source area.

3. The integrated circuit of claim 1, in which said second drift region abuts said first drift region by semiconductor material of said substrate from said second drain area to said second channel/source area.

4. The integrated circuit of claim 1, in which said second drift region and said first drift region have a same layer structure.

5. The integrated circuit of claim 1, in which said second drift region and said first drift region have a different layer structure.

6. The integrated circuit of claim 1, in which at least one of said first drift region and said second drift region includes a buried double-sided RESURF layer.

7. The integrated circuit of claim 1, in which:

said substrate includes a base substrate and an epitaxial layer disposed on said base substrate; and at least one of said first drift region and said second drift region includes an n-type buried layer at a boundary between said base substrate and said epitaxial layer.

8. The integrated circuit of claim 1, in which:

said substrate includes a base substrate and an epitaxial layer disposed on said base substrate; and at least one of said first drift region and said second drift region includes an n-type double-sided RESURF drift layer with laterally graded doping density at a boundary between said base substrate and said epitaxial layer.

9. The integrated circuit of claim 1, in which:

field oxide is disposed at said top surface of said substrate with an opening in said second channel/source area;

an n-type buried layer is disposed in said substrate in said second channel/source area and extending under said second body region and into said second drift region so as to contact said second drift region; and an n-type isolation barrier well is disposed in said substrate in said second channel/source area surrounding said second body region;

so that said field oxide and said isolation barrier well combined with said second drift region laterally surround said second body region and connect to said buried layer so as to electrically isolate said second body region from said substrate outside said second channel/source area.

10. The integrated circuit of claim 1, in which:

field oxide is disposed at said top surface of said substrate with an opening in said second channel/source area;

said second drift region extends into said second channel/source area under said second body region and up to said field oxide, so that said second drift region surrounds said second body region on all sides and on a bottom surface of said second body region so that said second drift region electrically isolates said second body region from said substrate outside said second channel/source area.

11. An integrated circuit, comprising:

a p-type semiconductor substrate;

a high voltage n-channel metal oxide semiconductor (MOS) power transistor integrated with a high voltage n-channel MOS blocking transistor, said power transistor including:

a central drain area;

an n-type drain contact region disposed at a top surface of said substrate in said power transistor drain area;

a drift area surrounding said power transistor drain area except at said blocking transistor;

an n-type drift layer in said power transistor drift area, said power transistor drift layer contacting and making electrical connection to said power transistor drain contact region, said power transistor drift layer surrounding said power transistor drain area except at said blocking transistor;

a channel/source area surrounding said power transistor drift area except at said blocking transistor; and a p-type body in said power transistor channel/source area, said power transistor body being directly electrically connected to said substrate, said power transistor body said power transistor drift area except at said blocking transistor; and said blocking transistor including;

a drain area contiguous with said power transistor drain area;

an n-type drain contact region disposed at said top surface of said substrate in said blocking transistor drain area, said blocking transistor drift layer contacting and making electrical connection to said blocking transistor drain contact region, said blocking transistor drain contact region being electrically coupled to said power transistor drain contact region through n-type doped regions in said substrate;

a drift area abutting said blocking transistor drain area, so that a boundary between said blocking transistor drain area and said blocking transistor drift area is aligned with a boundary between said power transistor drain area and said power transistor drift area;

an n-type drift layer in said blocking transistor drift area, so that said power transistor drift area is laterally adjacent to both sides of said blocking transistor drift area;

a channel/source area abutting said blocking transistor drift area opposite from said blocking transistor drain area and proximate to said power transistor channel/source area; and a p-type body in said blocking transistor channel/source area, said blocking transistor body being electrically isolated from said substrate by a body isolation structure.

12. The integrated circuit of claim 11, in which said blocking transistor drift area is separated from said power transistor drift area by semiconductor material of said substrate from said blocking transistor drain area to said blocking transistor channel/source area.

13. The integrated circuit of claim 11, in which said blocking transistor drift area abuts said power transistor drift area by semiconductor material of said substrate from said blocking transistor drain area to said blocking transistor channel/source area.

14. The integrated circuit of claim 11, in which said blocking transistor drift layer and said power transistor drift layer have a same layer structure.

15. The integrated circuit of claim 11, in which said blocking transistor drift layer and said power transistor drift layer have a different layer structure.

16. The integrated circuit of claim 11, in which at least one of said power transistor drift layer and said blocking transistor drift layer includes a buried double-sided RESURF layer.

17. The integrated circuit of claim 11, in which:

said substrate includes a base substrate and an epitaxial layer disposed on said base substrate; and at least one of said power transistor drift layer and said blocking transistor drift layer includes an n-type buried layer at a boundary between said base substrate and said epitaxial layer.

18. The integrated circuit of claim 11, in which:

said substrate includes a base substrate and an epitaxial layer disposed on said base substrate; and at least one of said power transistor drift layer and said blocking transistor drift layer includes an n-type double-sided RESURF drift layer with laterally graded doping density at a boundary between said base substrate and said epitaxial layer.

19. The integrated circuit of claim 11, in which:

field oxide is disposed at said top surface of said substrate with an opening in said blocking transistor channel/source area;

an n-type buried layer is disposed in said substrate in said channel/source area and extending under said blocking transistor body and into said blocking transistor drift area so as to contact said blocking transistor drift layer; and an n-type isolation barrier well is disposed in said substrate in said blocking transistor channel/source area surrounding said blocking transistor body;

so that said field oxide and said isolation barrier well combined with said blocking transistor drift layer laterally surround said blocking transistor body and connect to said buried layer so as to electrically isolate said blocking transistor body from said substrate outside said blocking transistor channel/source area.

20. The integrated circuit of claim 11, in which:

field oxide is disposed at said top surface of said substrate with an opening in said blocking transistor channel/source area;

said blocking transistor drift layer extends into said blocking transistor channel/source area under said blocking transistor body and up to said field oxide, so that said blocking transistor drift layer surrounds said blocking transistor body on all sides and on a bottom surface of said blocking transistor body so that said blocking transistor drift layer electrically isolates said blocking transistor body from said substrate outside said blocking transistor channel/source area.

* * * * *